(12) United States Patent
Kondo

(10) Patent No.: US 10,566,931 B2
(45) Date of Patent: Feb. 18, 2020

(54) ELECTRONIC COMPONENT AND ELECTRONIC APPARATUS

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/983,609

(22) Filed: May 18, 2018

(65) Prior Publication Data

US 2018/0342981 A1 Nov. 29, 2018

(30) Foreign Application Priority Data

May 29, 2017 (JP) ................................. 2017-105373

(51) Int. Cl.
*H03B 5/36* (2006.01)
*H01L 41/047* (2006.01)
*H01L 41/053* (2006.01)
*H03H 9/05* (2006.01)
*H03H 9/10* (2006.01)
*H03H 9/09* (2006.01)
*H03L 1/04* (2006.01)

(52) U.S. Cl.
CPC ............ *H03B 5/36* (2013.01); *H01L 41/0477* (2013.01); *H01L 41/0533* (2013.01); *H01L 41/0536* (2013.01); *H03H 9/0547* (2013.01); *H03H 9/09* (2013.01); *H03H 9/1014* (2013.01); *H03L 1/04* (2013.01)

(58) Field of Classification Search
CPC .. H03B 5/32; H03B 5/36; H03L 1/028; H03L 1/04; H01L 2924/00; H01L 2224/48247; H01L 2224/4826; H01L 2224/48227; H01L 2225/1029; H01L 23/4951; H01L 23/49811; H01L 24/49; H01L 2224/4917; H01L 23/49555; H01L 41/053; H01L 41/047; H01L 41/0477; H01L 41/0533
See application file for complete search history.

(56) References Cited

U.S. PATENT DOCUMENTS

| 5,068,712 | A | * | 11/1991 | Murakami | .......... | H01L 23/3107 |
| | | | | | | 257/676 |
| 2015/0123742 | A1 | * | 5/2015 | Naito | ........................ | H03H 9/17 |
| | | | | | | 331/158 |
| 2016/0029484 | A1 | * | 1/2016 | Kondo | ..................... | H03B 5/32 |
| | | | | | | 331/158 |
| 2016/0379954 | A1 | * | 12/2016 | Cahill | ................. | H01L 25/0657 |
| | | | | | | 257/659 |

FOREIGN PATENT DOCUMENTS

JP H07-321591 A 12/1995

* cited by examiner

*Primary Examiner* — Ryan Johnson
(74) *Attorney, Agent, or Firm* — Oliff PLC

(57) ABSTRACT

A quartz crystal oscillator as an electronic component includes a base section as a first substrate having a lower surface as a first surface, a first lead terminal connected to the first surface, and a second lead terminal connected to the first surface, and the first lead terminal and the second lead terminal intersect each other when viewed in a first direction along the first surface.

13 Claims, 12 Drawing Sheets

ELECTRONIC COMPONENT AND ELECTRONIC APPARATUS

BACKGROUND

1. Technical Field

The present invention relates to an electronic component and an electronic apparatus.

2. Related Art

As an example of an electronic component that is capable of preventing breakage due, for example, to impact acting on a circuit substrate or any other component to which the electronic component is connected or an electronic component that excels in what is called impact resistance, there is a known quartz crystal device described, for example, in JP-A-7-321591. In the quartz crystal device described in JP-A-7-321591, a quartz crystal vibrator element is incorporated in the internal space of a package formed of a metal outer ring and a cap, and lead terminals connected to the quartz crystal vibrator element pass through the metal outer ring. Further, a plate-shaped elastic lead piece (electrically conductive elastic element) configured to have, for example, the shape of a coil and therefore serve as a spring is welded to each of the lead terminals outside the package. The quartz crystal device is mounted on a circuit substrate via the elastic lead pieces connected to the lead terminals.

In the quartz crystal device described in JP-A-7-321591, however, since the root portions of the lead terminals that protrude from the package and the portions where the lead terminals and the elastic lead pieces are connected to each other do not have elasticity, the root portions or the connection portions cannot sufficiently absorb stress applied thereto depending on the magnitude of the stress, and the characteristics of the quartz crystal vibrator element or any other element accommodated in the package are undesirably affected.

SUMMARY

An advantage of some aspects of the invention is to solve at least a part of the problems described above, and the invention can be implemented as the following forms or application examples.

Application Example 1

An electronic component according to this application example includes a first substrate having a first surface, a first lead terminal connected to the first surface, and a second lead terminal connected to the first surface, and the first lead terminal and the second lead terminal intersect each other when viewed in a first direction along the first surface.

In the electronic component according to this application example, since the first lead terminal and the second lead terminal, which are connected to the first surface of the first substrate and intersect each other when viewed in the first direction along the first surface, are allowed to each have a long lead length, as compared to a case where the first lead terminal and the second lead terminal do not intersect each other, the spring characteristic of the first and second lead terminals is improved, whereby a higher degree of cushioning effect of absorbing externally acting impact force or any other type of force can be provided, and the influence of the stress on the characteristics and other factors of the electronic component can therefore be reduced.

Application Example 2

In the electronic component described in the application example, it is preferable that the first lead terminal and the second lead terminal do not overlap with each other when viewed in a second direction perpendicular to the first surface.

According to this application example, the risk of contact between the first lead terminal and the second lead terminal can be reduced.

Application Example 3

It is preferable that the electronic component described in the application example further includes a second substrate, that the first lead terminal has a first end connected to the first surface and a second end connected to the second substrate, and that the second end is so disposed as to be separate outward from the first substrate when viewed in the second direction.

According to this application example, the second end so disposed as to be separate outward from the first substrate and connected to the second substrate, that is, the connection states of between the second substrate and the second end can be visually recognized when viewed in the second direction perpendicular to the first surface, whereby the quality of the state of the connection between the first lead terminal and the second substrate can be readily checked.

Application Example 4

In the electronic component described in the application example, it is preferable that the second lead terminal has a third end connected to the first surface and a fourth end connected to the second substrate, and that the fourth end is so disposed as to be separate outward from the first substrate when viewed in the second direction.

According to this application example, the fourth end so disposed as to be separate outward from the first substrate and connected to the second substrate, that is, the connection states of between the second substrate and the fourth end can be visually recognized when viewed in the second direction, whereby the quality of the state of the connection between the second lead terminal and the second substrate can be readily checked.

Application Example 5

In the electronic component described in the application example, it is preferable that the first surface has a first edge and a second edge facing the first edge, that the first lead terminal has a first end connected to an area that is part of the first surface and closer to the first edge than to the second edge, and that the second lead terminal has a third end connected to an area that is part of the first surface and closer to the second edge than to the first edge.

According to this application example, since the first end of the first lead terminal is connected to the area that is part of the first surface and close to the first edge, and the third end of the second lead terminal is connected to the area that is part of the first surface and close to the second edge facing the first edge, the intersecting first and second lead terminals can be further lengthened, whereby what is called a cushioning effect of absorbing externally acting impact force or any other type of force can be sufficiently provided.

Application Example 6

In the electronic component described in the application example, it is preferable that the first and the third end are so disposed as to be oriented in opposite directions.

According to this application example, since the first and the third end are so disposed as to be oriented in opposite directions, the intersecting first and second lead terminals can be further lengthened, whereby what is called a cushioning effect of absorbing externally acting impact force or any other type of force can be sufficiently provided.

Application Example 7

It is preferable that the electronic component described in the application example further includes an element disposed in an area surrounded by the first lead terminal, the second lead terminal, and the first surface when viewed in the first direction.

According to this application example, the space between the first lead terminal/second lead terminal and the first surface can be effectively used, whereby the element arrangement efficiency can be improved. The size of the electronic component can therefore be reduced.

Application Example 8

It is preferable that the electronic component described in the application example further includes a container containing the first substrate and a vibrator accommodated in the container.

According to this application example, the intersecting first and second lead terminals can improve the impact resistance of the vibrator accommodated in the container containing the first substrate.

Application Example 9

An electronic apparatus according to this application example includes an electronic component including a first substrate having a first surface, a first lead terminal connected to the first surface, and a second lead terminal connected to the first surface, and the first lead terminal and the second lead terminal intersect each other when viewed in a first direction along the first surface.

The electronic apparatus according this application example includes an electronic component so configured that the first lead terminal and the second lead terminal, which are connected to the first surface of the first substrate and intersect each other when viewed in the first direction along the first surface, are allowed to each have a long lead length, as compared to a case where the first lead terminal and the second lead terminal do not intersect each other, and the spring characteristic of the first and second lead terminals is therefore improved, whereby a higher degree of cushioning effect of absorbing externally acting impact force or any other type of force can be provided. An electronic apparatus capable of stabilizing the anti-impact characteristic and other characteristics can therefore be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described below in detail with reference to the drawings. It is not intended that the embodiments described below unduly limit the contents of the invention set forth in the appended claims. Further, all configurations described in the embodiments are not necessarily essential configuration requirements of the invention.

First Embodiment

Configuration

Figure 1:
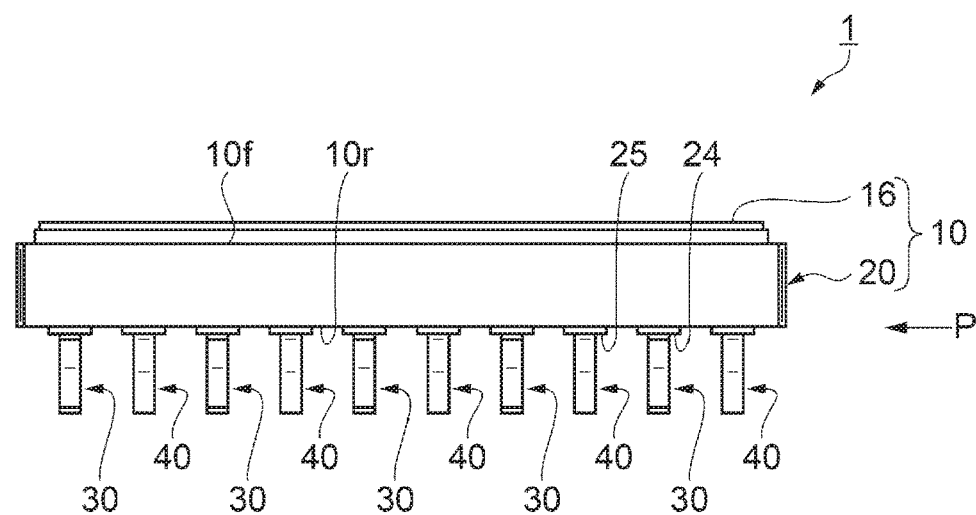
FIG. 1 is a front view of an oscillator according to a first embodiment of an electronic component.
Figure 2:
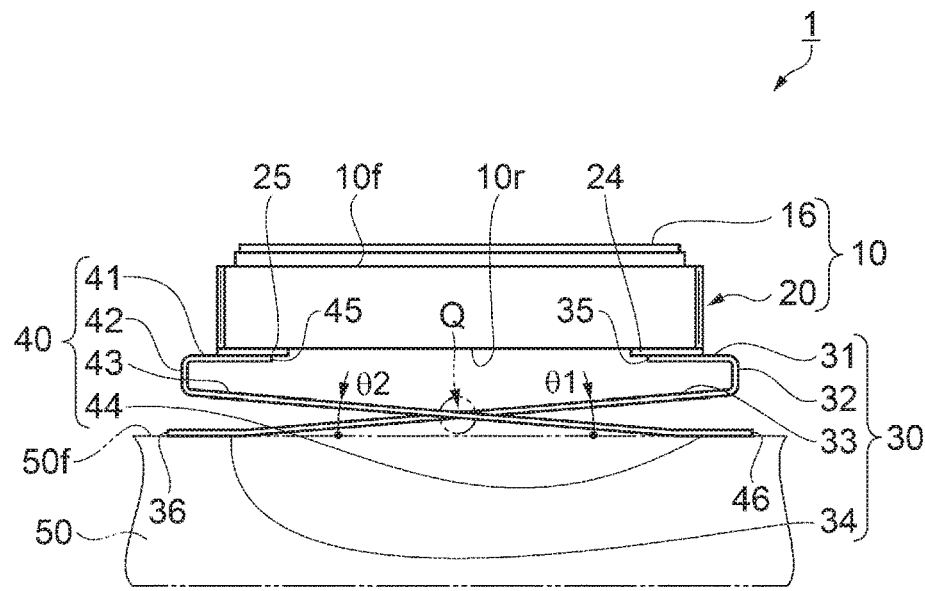
FIG. 2 is a side view of the oscillator according to the first embodiment viewed in the direction indicated by the arrow P shown in FIG. 1.
Figure 3:
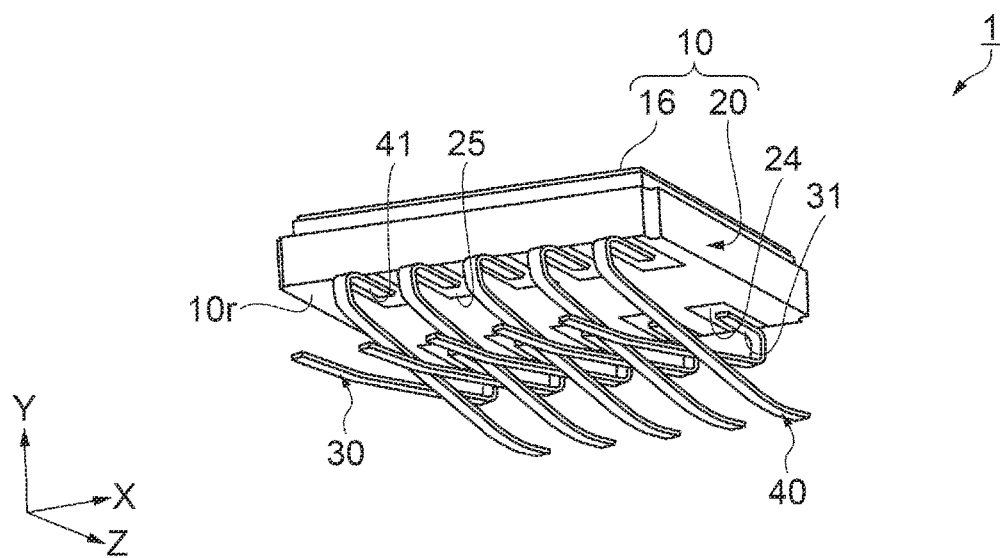
FIG. 3 is a perspective view of the oscillator according to the first embodiment viewed from the side facing lead terminals of the oscillator.
Figure 4:
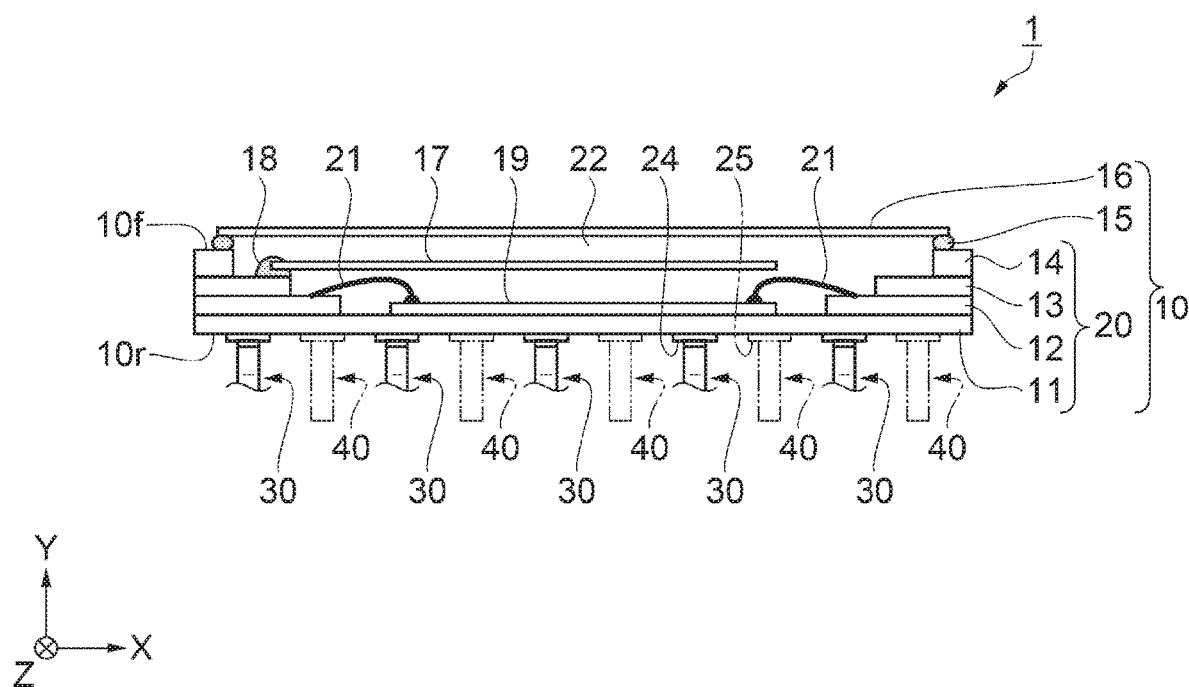
FIG. 4 is a front cross-sectional view of the oscillator according to the first embodiment.
Figure 5:
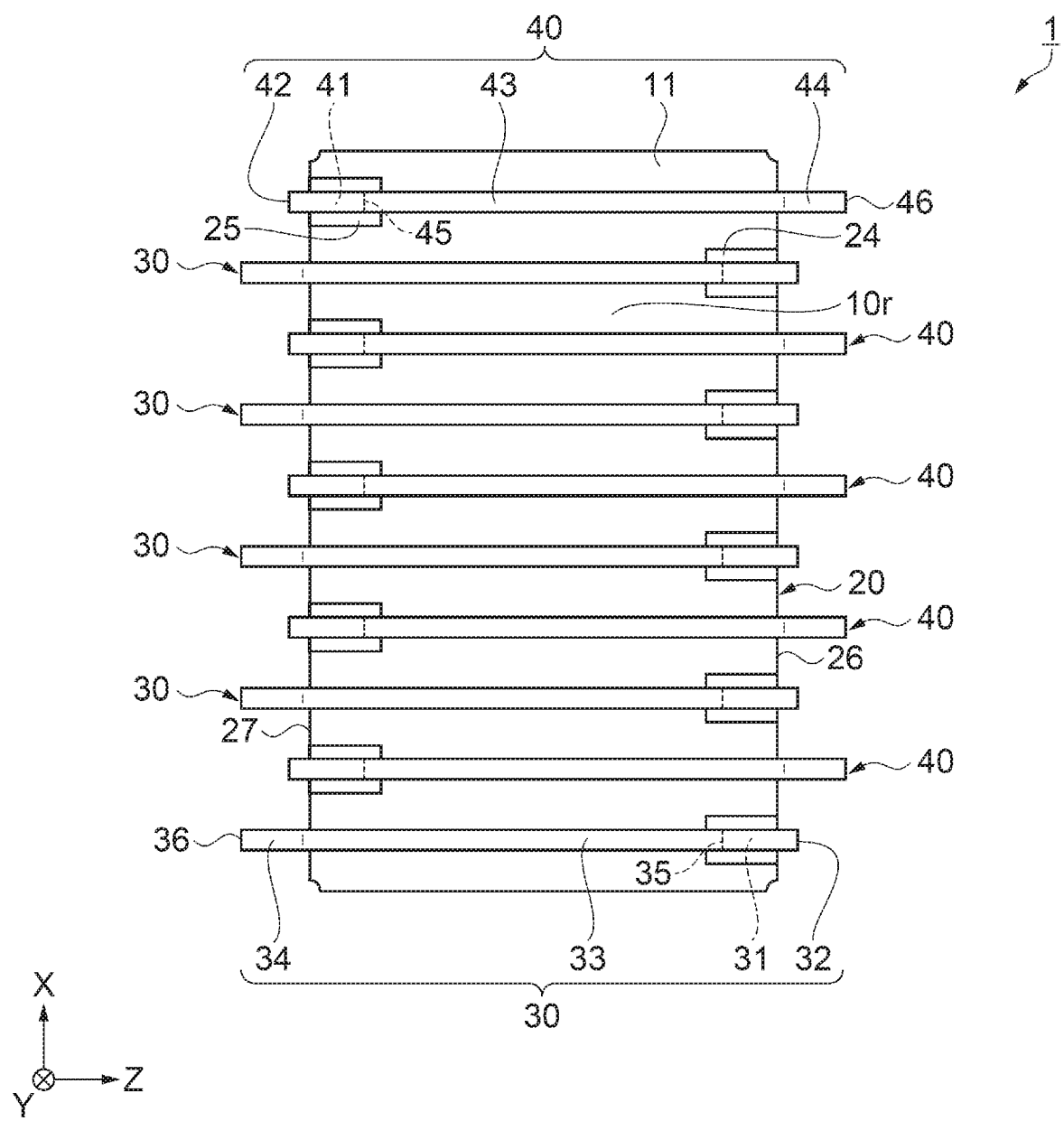
FIG. 5 is a bottom view of the oscillator according to the first embodiment.

As an example of an oscillator according to a first embodiment of an electronic component, a quartz crystal oscillator including an SC-cut quartz crystal vibrator element, which excels in frequency stability, is presented, and the configuration of the quartz crystal oscillator will be described with reference to FIGS. 1 to 5. FIG. 1 is a front view of the oscillator according to the first embodiment of the electronic component. FIG. 2 is a side view of the oscillator according to the first embodiment viewed in the direction indicated by the arrow P shown in FIG. 1. FIG. 3 is a perspective view of the oscillator according to the first embodiment viewed from the side facing lead terminals of the oscillator. FIG. 4 is a front cross-sectional view of the oscillator according to the first embodiment. FIG. 5 is a bottom view of the oscillator according to the first embodiment. FIGS. 1 to 5 as well as the drawings to be referred to later show X, Y and Z axes as three axes perpendicular to one another for ease of description.

The Y axis extends in the thickness direction of the quartz crystal oscillator, in other words, the direction in which a base section that forms a container and a lid member bonded to the base section are arranged, and the Y axis coincides with the direction perpendicular to a plane containing the direction in which first lead terminals and second lead terminals are arranged. The X axis extends in the direction in which the first lead terminals and the second lead terminals are arranged. The direction along the Y axis from the base section toward the lid member is called a +Y-axis direction, and the direction opposite the +Y-axis direction is called a −Y-axis direction. Further, in a plan view viewed in the Y-axis direction, a surface on the +Y-axis-direction side is called an upper surface, and a surface on the −Y-axis-direction side is called a lower surface in the following description in some cases. Wiring patterns or electrode pads (terminal electrodes) formed in a container 10 including a first base 11 are omitted in the drawings.

A quartz crystal oscillator 1 as the oscillator according to the first embodiment includes a container 10, which is formed of abase section 20 and a lid member 16 connected to an upper surface 10f of the base section 20, and first lead terminals 30 and second lead terminals 40, which are a plurality of lead terminals connected to first connection terminals 24 and second connection terminals 25 provided on a lower surface 10r of the base section 20, as shown in FIGS. 1, 2, and 3. In the present embodiment, the base section 20 corresponds to a first substrate, and the lower surface 10r of the base section 20 corresponds to a first surface. The lower surface 10r of the base section 20 is a surface that is part of the base section 20 and opposite the side to which the lid member 16 is connected and can also be called the lower surface of the container 10.

The container 10 includes a first base 11, a second base 12, a third base 13, and a fourth base 14 and the lid member 16 connected to the fourth base 14 via a sealing member 15, as shown in FIG. 4. The first base 11, the second base 12, the third base 13, and the fourth base 14 are layered on each other in this order to form the base section 20. The second base 12, the third base 13, and the fourth base 14 are each a ring-shaped element with a central portion thereof removed, and the sealing member 15, such as a seal ring and a low melting glass member, is formed along the circumferential edge of the upper surface 10f of the fourth base 14. The first base 11, the second base 12, the third base 13, and the fourth base 14 are preferably made, for example, of a ceramic material. The first base 11, the second base 12, the third base 13, or the fourth base 14 is not necessarily made of a ceramic material and may instead be made, for example, of a glass, resin, or metal material. The base section 20 may instead include a member which has a plurality of internal steps with at least some of the steps integrated with one another.

The container 10 has a recess (cavity) formed by the second base 12 and the third base 13, which are each a ring-shaped element with a central portion thereof removed, and accommodating an integrated circuit 19. Similarly, the container 10 has a recess (cavity) formed by the third base 13 and the fourth base 14, which are each a ring-shaped element with a central portion thereof removed, and accommodating a quartz crystal vibrator element 17 as a vibrator. The container 10 is provided with an internal space 22 when the recesses (cavities) are closed with the lid member 16.

The internal space 22, which is the interior of the container 10, accommodates the integrated circuit 19 and the quartz crystal vibrator element 17. The interior of the container 10 is hermetically sealed to form a reduced-pressure atmosphere that is, for example, a vacuum or has pressure lower than the atmospheric pressure or an inert gas atmosphere formed, for example, of nitrogen, argon, or helium.

The integrated circuit 19 is bonded via a bonding member (not shown) to a portion of the upper surface of the first base 11, the portion corresponding to the removed central portion of the second base 12. The integrated circuit 19 is electrically connected to electrode pads (not shown) disposed on the upper surface of the second base 12 via bonding wires 21. The quartz crystal vibrator element 17 is bonded in a predetermined position on the upper surface of the third base 13 via a bonding member 18, such as an electrically conductive adhesive. The quartz crystal vibrator element 17 except the portion bonded via the bonding member 18 is so held in the internal space 22 as to be separate from the other members.

The first connection terminals 24 and the second connection terminals 25 electrically continuous, for example, with the quartz crystal vibrator element 17 and the integrated circuit 19 via internal wiring (not shown) are provided on the lower surface of the first base 11, which is the lower surface 10r of the base section 20, as shown in FIG. 5. The lower surface of the first base 11 has a first edge 26, which is located on the +Z-axis-direction side, and a second edge 27, which is located on the −Z-axis-direction side and faces the first edge 26. Five first connection terminals 24 are arranged at predetermined intervals along the first edge 26 on the side facing the first edge 26, and five second connection terminals 25 are arranged at predetermined intervals along the second edge 27 on the side facing the second edge 27. In other words, the first connection terminals 24 are provided in an area that is part of the lower surface 10r and closer to the first edge 26 than to the second edge 27, and the second connection terminals 25 are provided in an area that is part of the lower surface 10r and closer to the second edge 27 than to the first edge 26.

The numbers of first connection terminals 24 and second connection terminals 25 are not limited to specific numbers and may each be any numbers. The first connection terminals 24 and the second connection terminals 25 can be formed, for example, by using a method including printing a metal wiring material, such as tungsten (W) and molybdenum (Mo), on the lower surface of the first base 11 in a screen printing process, burning the printed material, and plating nickel (Ni), gold (Au), or any other substance on the burned material.

The first lead terminals 30 are connected to the first connection terminals 24, and the second lead terminals 40 are connected to the second connection terminals 25. The connection between the first connection terminals 24 and the first lead terminals 30 and the connection between the second connection terminals 25 and the second lead terminals 40 are preferably made, for example, by using solder or any other electrically conductive bonding members.

The first lead terminals 30 each include a connection pad 31, which is connected to the corresponding first connection terminal 24 via the bonding member (not shown), a bent section 32, which is extended from the connection pad 31 and bent, a lead section 33, which is bent with respect to the bent section 32 and extends toward the second edge 27 (in −Z-axis direction) obliquely with respect to the −Z-axis and −Y-axis directions with the distance between the lead section 33 and the lower surface 10r of the base section 20 increasing with distance from the bent section 32, and a lead end section 34, which extends from the lead section 33, as shown in FIG. 2. The first lead terminals 30 further each have a first end 35, which is an end (edge) of the connection pad 31, and a second end 36, which is an end (edge) opposite the first end 35 and is located on the side facing the lead end section 34.

In detail, the connection pads 31, which have the first ends 35, are connected to the first connection terminals 24 and extend from the first ends 35 outward away from the base section 20 (in +Z-axis direction). That is, the first lead terminals 30 are so configured that the connection pads 31 having the first ends 35 are connected to the first connection terminals 24 located in the area that is part of the lower surface 10r of the base section 20 and closer to the first edge 26 than to the second edge 27. The bent sections 32 are each a portion that is bent in the −Y-axis direction at a first bending point located on the side opposite the first end 35 of the connection pad 31, which extends outward away from the base section 20 (in +Z-axis direction).

The lead sections 33 are each a portion that is folded back at a second bending point located in a position opposite the first bending point and extends from the bent section 32 in the direction (−Z-axis direction) opposite the direction in which the connection pad 31 extends (+Z-axis direction). The lead sections 33 in the present embodiment are each a roughly linear portion and may each have a curved portion, a bent portion, and any other portion. The lead end sections 34 are each a portion connected to a mounting substrate 50 or any other component, for example, in a soldering process, and the lead end sections 34 are so bent with respect to the lead section 33 as to be parallel to the mounting substrate 50 and have the second ends 36, which are the ends opposite the first ends 35, which are one-side ends of the first lead terminals 30.

Since the first ends 35 of the first lead terminals 30 are connected to the first connection terminals 24, which are located in the area that is part of the lower surface 10r of the base section 20 and close to the first edge 26, and the lead sections 33 extend toward the second edge 27, which faces the first edge 26, as described above, the first lead terminals can be further lengthened, whereby what is called a cushioning effect of absorbing externally acting impact force or any other type of force can be enhanced.

The second ends 36 of the first lead terminals 30 are preferably so disposed as to be separate outward from the outer circumferential edge of the base section 20 when viewed in a second direction (Y-axis direction) perpendicular to the lower surface 10r of the base section 20. The arrangement of the second ends 36 of the first lead terminals 30 readily allows visual recognition, in the second direction, of the state of the second ends 36, for example, the state of connection between the second ends 36 and the mounting substrate 50.

The second lead terminals 40 each include a connection pad 41, which is connected to the corresponding second connection terminal 25 via a bonding member (not shown), a bent section 42, which is extended from the connection pad 41 and bent, a lead section 43, which is bent with respect to the bent section 42 and extends obliquely with respect to the +Z-axis and −Y-axis directions with the distance between the lead section 43 and the lower surface 10r of the base section 20 increasing with distance from the bent section 42, and a lead end section 44, which extends from the lead section 43, as shown in FIG. 2. The second lead terminals 40 further each have a third end 45, which is an end facing the connection pad 41, and a fourth end 46, which is an end opposite the third end 45 and is located on the side facing the lead end section 44.

In detail, the connection pads 41, which have the third ends 45, are connected to the second connection terminals 25 and extend from the third ends 45 outward away from the base section 20 (in −Z-axis direction). That is, the second lead terminals 40 are so configured that the connection pads 41 having the third ends 45 are connected to the second connection terminals 25, which are located in the area that is part of the lower surface 10r of the base section 20 and closer to the second edge 27 than to the first edge 26. The bent sections 42 are each a portion that is bent in the −Y-axis direction at a first bending point located on the side opposite the third end 45 of the connection pad 41, which extends outward away from the base section 20 (in −Z-axis direction).

The lead sections 43 are each a portion that is folded back at a second bending point located in a position opposite the first bending point and extends from the bent section 42 in the direction (+Z-axis direction) opposite the direction in which the connection pad 41 extends (−Z-axis direction). The lead sections 43 in the present embodiment are each a roughly linear portion and may each have a curved portion, a bent portion, or any other portion. The lead end sections 44 are each a portion connected to the mounting substrate 50 or any other component, for example, in a soldering process, and the lead end sections 44 are so bent with respect to the lead section 43 as to be parallel to the mounting substrate 50 and have the fourth ends 46 opposite the third ends 45, which are one-side ends of the second lead terminals 40.

Since the third ends 45 of the second lead terminals 40 are connected to the second connection terminals 25, which are located in the area that is part of the lower surface 10r of the base section 20 and close to the second edge 27, and the lead sections 43 extend toward the first edge 26, which faces the second edge 27, as described above, the second lead terminals 40 can be further lengthened, whereby what is called a cushioning effect of absorbing externally acting impact force or any other type of force can be enhanced.

The fourth ends 46 of the second lead terminals 40 are preferably so disposed as to be separate outward from the outer circumferential edge of the base section 20 when viewed in the second direction (Y-axis direction) perpendicular to the lower surface 10r of the base section 20. The arrangement of the fourth ends 46 of the second lead terminals 40 readily allows visual recognition, in the second direction, of the state of the fourth ends 46, for example, the state of connection between the fourth ends 46 and the mounting substrate 50.

The first lead terminals 30 and the second lead terminals 40 are disposed in a staggered configuration (alternately disposed). The first ends 35 of the first lead terminals 30 and the third ends 45 of the second lead terminals 40 are so disposed as to be oriented in opposite directions. In the present embodiment, the first ends 35 are oriented in the −Z-axis direction, and the third ends 45 are oriented in the +Z-axis direction. When the thus disposed first lead terminals 30 and second lead terminals 40 are viewed in a first direction (X-axis direction) along the lower surface 10r of the base section 20, the lead sections 33 of the first lead terminals 30 and the lead sections 43 of the second lead terminals 40 intersect each other in an area Q, which is located roughly at the center in the width direction of the base section 20 (Z-axis direction). Since the first lead terminals 30 and the second lead terminals 40 extend in opposite directions as described above, the intersecting first lead terminals 30 and second lead terminals 40 can be further lengthened, whereby what is called a cushioning effect of absorbing externally acting impact force or any other type of force can be sufficiently provided.

The first lead terminals 30 and the second lead terminals 40 preferably do not overlap with each other when viewed in the second direction (Y-axis direction) perpendicular to the lower surface 10r of the base section 20. The arrangement of the first lead terminals 30 and the second lead terminals 40 allows reduction in the risk of contact between the first lead terminals 30 and the second lead terminals 40.

The first lead terminals 30 and the second lead terminals 40 each have a plate-like shape that is narrow in the X-axis direction when viewed in the Z-axis direction, and the bent sections 32 and 42 and the bent portions of the lead sections 33 and 43 are preferably bent in the thickness direction of the bent sections and the lead sections, which is a direction that intersects the X-axis direction, whereby the cushioning effect is more readily provided.

The lead sections 33 and 43 are preferably configured to incline by angles θ1 and θ2 greater than or equal to 1° but smaller than or equal to 30°, respectively, with respect to an upper surface 50f of the mounting substrate 50 as a second substrate on which the quartz crystal oscillator 1 is mounted. The inclination of the lead sections 33 and 43 by the angles θ1 and θ2 described above allows the cushioning effect of absorbing impact force or any other type of stress to be further enhanced. The angles θ1 and θ2 between the lead sections 33, 43 and the upper surface 50f of the mounting substrate 50 are more preferably greater than or equal to 3° but smaller than or equal to 10°. In this case, the quartz crystal oscillator 1 can be thinner, and the deformation of the lead sections 33 or 43 can further enhance the cushioning effect of absorbing impact force or any other type of stress.

The first lead terminals 30 and the second lead terminals 40 are each preferably formed of a plate made of a material having high electric conductivity and relatively good formability, such as a 42 alloy (iron-nickel alloy) and a copper alloy, with nickel plating or any other surface treatment provided on the plate.

Method for Forming Lead Terminals

An overview of a method for forming the lead terminals of the quartz crystal oscillator 1 as an example of the oscillator according to the first embodiment of the electronic component will next be described with reference to FIGS. 6A to 6F. FIGS. 6A, 6B, 6C, 6D, and 6E are side views showing the step of forming the lead terminals of the oscillator according to the first embodiment. FIG. 6F is a side view showing how to bond and fix the lead terminals of the oscillator according to the first embodiment to the second substrate. The same configurations as those of the quartz crystal oscillator 1 described above have the same reference characters in the following description.

Figure 6A:
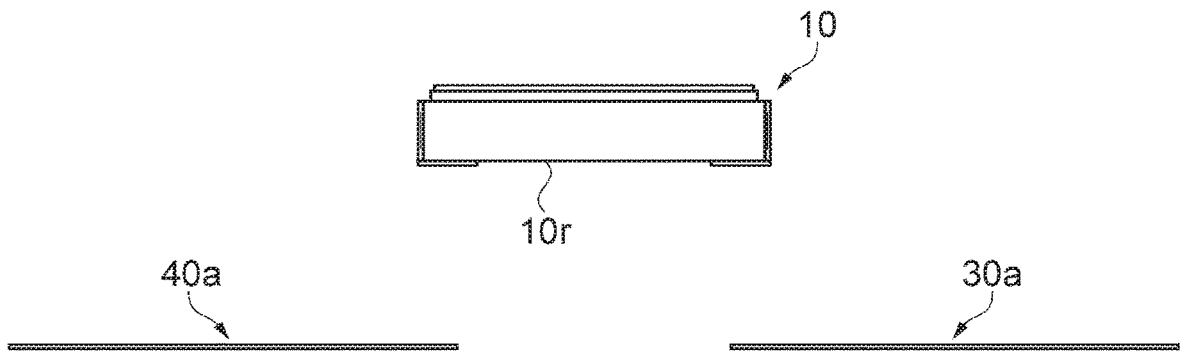
FIG. 6A is a side view showing the step of forming the lead terminals of the oscillator according to the first embodiment.

First, a lead frame (not shown) formed of raw members 30a for the plurality of first lead terminals 30 and raw members 40a for the plurality of second lead terminals 40 arranged at predetermined intervals and linked to each other via tie bars (not shown) is prepared and placed on the side facing the lower surface 10r of the container 10, as shown in FIG. 6A. The lead frame can be formed by processing a thin plate made, for example, of a 42 alloy (iron-nickel alloy) or a copper alloy, each of which is a material of which the first lead terminals 30 and the second lead terminals 40 are made, in a photoetching method, a stamping (pressing) method using a mold, or any other method. The raw members 30a for the first lead terminals 30 and the raw members 40a for the second lead terminals 40 are placed on a flat plate.

Figure 6B:
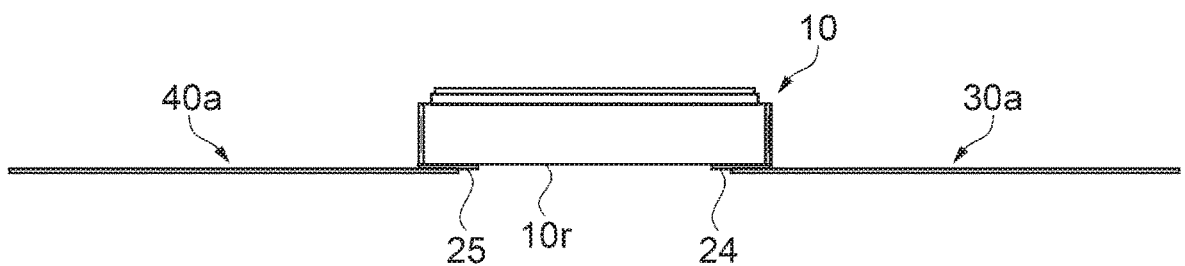
FIG. 6B is a side view showing the step of forming the lead terminals of the oscillator according to the first embodiment.

The lead frame, which is formed of the raw members 30a for the plurality of first lead terminals 30 and the raw members 40a for the plurality of second lead terminals 40 arranged at predetermined intervals, is then caused to face the first connection terminals 24 and the second connection terminals 25 disposed on the lower surface 10r of the container 10, and the lead frame is connected to the first connection terminals 24 and the second connection terminals 25 via electrically conductive bonding members, as shown in FIG. 6B. The electrically conductive bonding members can, for example, be solder paste produced by adding flux to solder powder in such a way that appropriate viscosity is achieved. The paste is applied in advance to the first connection terminals 24 and the second connection terminals 25 on the lower surface 10r of the container 10 in a printing method using a metal mask or an injection method using a dispenser. The paste bonding member is then heated to the melting temperature thereof to cause the paste bonding member to melt for connection of the raw members 30a for the plurality of first lead terminals 30 and the raw members 40a for the plurality of second lead terminals 40 to the first connection terminals 24 and the second connection terminals 25, respectively.

The bonding member is not limited to solder and can instead, for example, be an electrically conductive adhesive that is a mixture of a thermosetting resin and fillers made of gold, silver, copper, or any other metal. In the case where the thermosetting electrically conductive adhesive is used, the electrically conductive adhesive is heated to a temperature higher than or equal to the curing temperature thereof to connect the raw members 30a for the plurality of first lead terminals 30 and the raw members 40a for the plurality of second lead terminals 40 to the first connection terminals 24 and the second connection terminals 25, respectively.

Figure 6C:
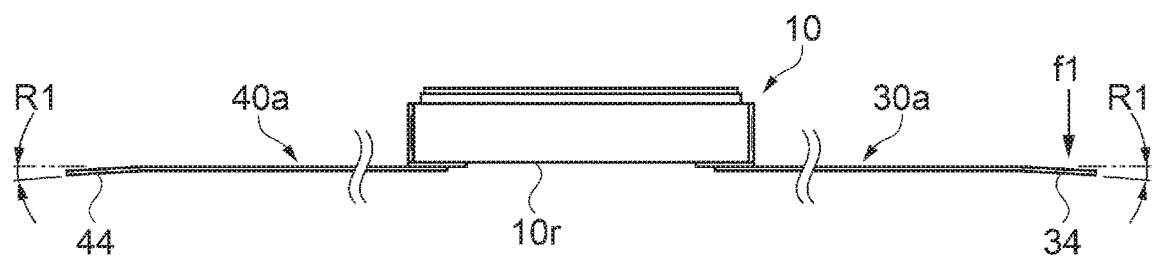
FIG. 6C is a side view showing the step of forming the lead terminals of the oscillator according to the first embodiment.

Front end portions of the first lead terminals 30 and the second lead terminals 40 are then bent by a predetermined angle R1 to form the lead end sections 34 and 44, respectively, as shown in FIG. 6C. In the formation process, the raw members 30a for the first lead terminals 30 and the raw members 40a for the second lead terminals 40 along with the container 10 are placed on a mold (die) that is not shown. A recess has been formed in the mold (die) in the position where the container 10 is placed, and the container 10 is accommodated in the recess. A mold (punch) then applies pressing force to the raw members 30a for the first lead terminals 30 and the raw members 40a for the second lead terminals 40 placed on the mold (die) to form the lead end sections 34 and 44.

Figure 6D:
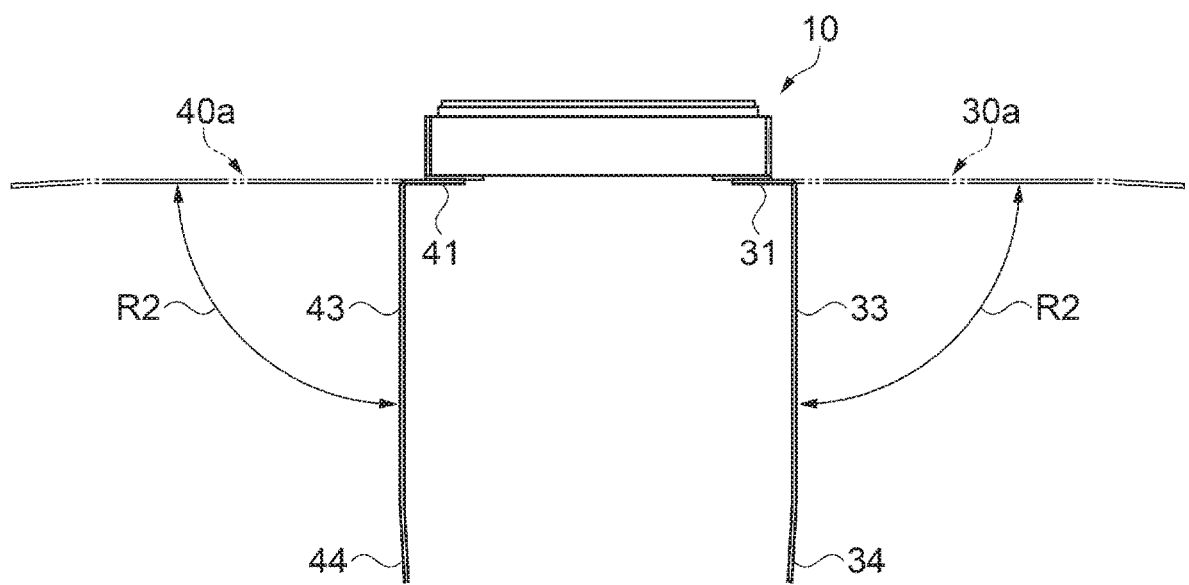
FIG. 6D is a side view showing the step of forming the lead terminals of the oscillator according to the first embodiment.
Figure 6E:
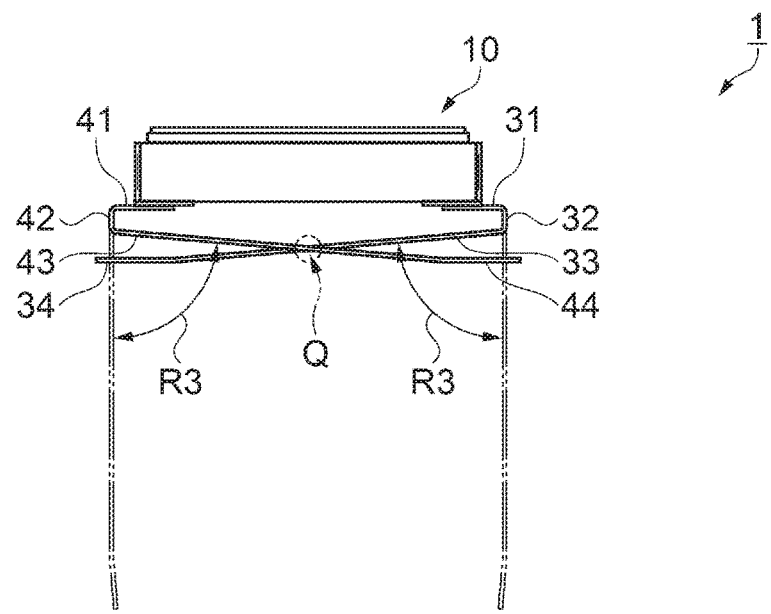
FIG. 6E is a side view showing the step of forming the lead terminals of the oscillator according to the first embodiment.
Figure 6F:
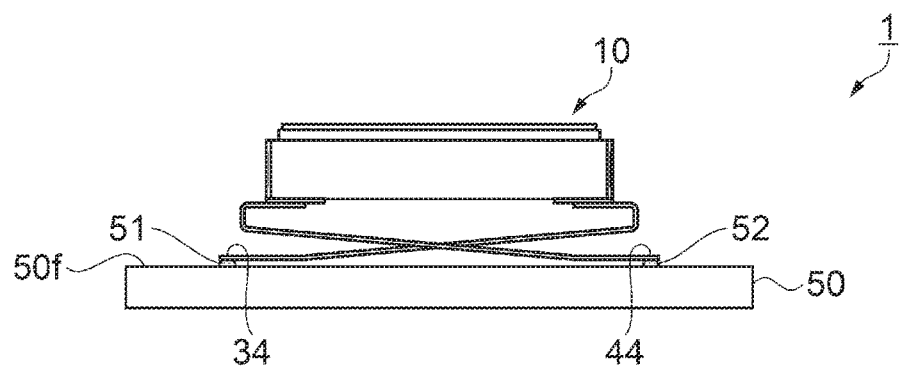
FIG. 6F is a side view showing how to bond and fix the lead terminals of the oscillator according to the first embodiment to a second substrate.

The raw members 30a for the first lead terminals 30 and the raw members 40a for the second lead terminals 40 are then bent by the die (punch) by a predetermined angle R2 at the position of the first bending point to form the lead sections 33 and 43 including the lead end sections 34 and 44, as shown in FIG. 6D. The raw members 30a for the first lead terminals 30 and the raw members 40a for the second lead terminals 40 are then further bent by the die (punch) by a predetermined angle R3 at the position of the second bending point to form the first lead terminals 30 and the second lead terminals 40, as shown in FIG. 6E. In this process, the first lead terminals 30 and the second lead terminals 40 are so bent at the second bending points as to face each other, and the bent first lead terminals 30 and second lead terminals 40 intersect each other in the position of the central area Q.

Although not shown, the tie bars formed in the lead frame and other components are then cut away to allow the first lead terminals 30 and the second lead terminals 40 to be separate from each other. The quartz crystal oscillator 1 is thus formed.

The quartz crystal oscillator 1, specifically, the lead end sections 34 and 44 of the first lead terminals 30 and the second lead terminals 40, which intersect each other in the central area Q, can be connected to the mounting substrate 50 as the second substrate, as shown in FIG. 6F. The lower surfaces of the lead end sections 34 and 44 mounted on the upper surface 50f of the mounting substrate 50 or the surfaces facing the mounting substrate 50 are so formed as to be roughly parallel to the upper surface 50f of the mounting substrate and connected to connection terminals (not shown) of the mounting substrate 50 by using solder or any other bonding members.

Figure 7:
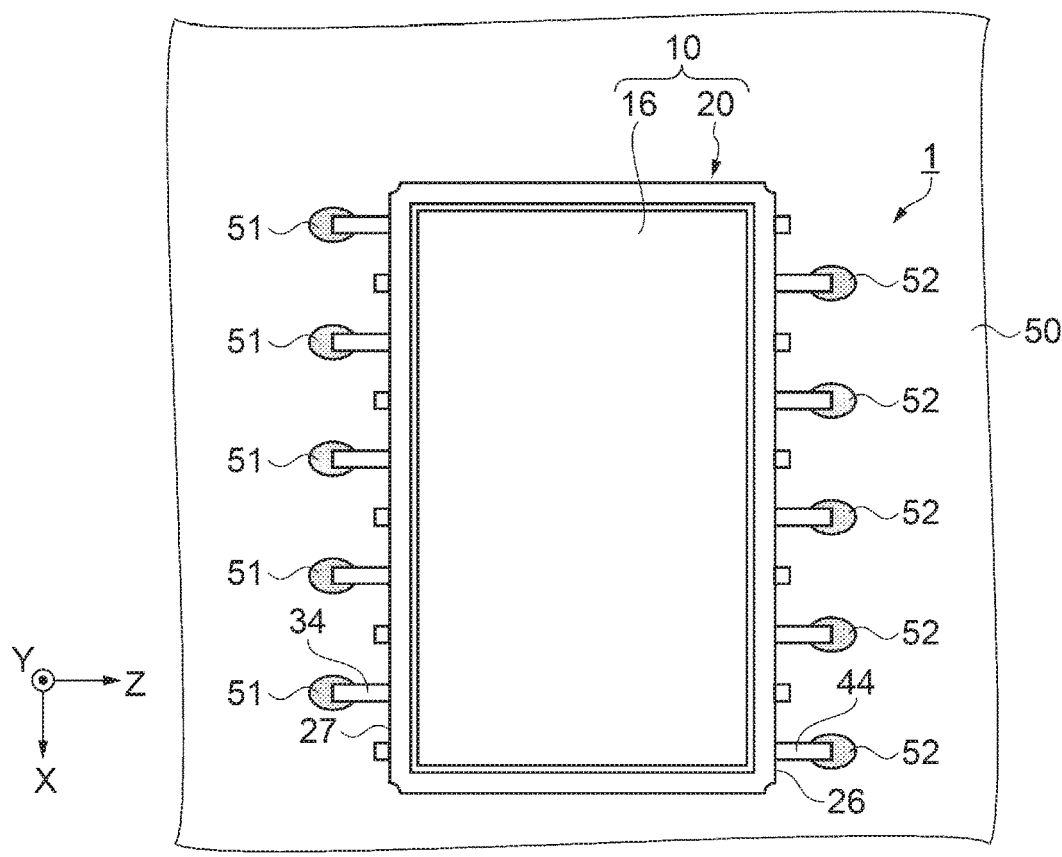
FIG. 7 is a plan view showing the correlation between the lead terminals of the oscillator and the second substrate.

In the connection of the first lead terminals 30 and the second lead terminals 40 to the mounting substrate 50, the second ends 36 of the first lead terminals 30 and the fourth ends 46 of the second lead terminals 40 are preferably disposed as will be described below in detail with reference to FIG. 7. FIG. 7 is a plan view showing the correlation between the lead terminals of the oscillator and the second substrate (mounting substrate 50).

The second ends 36 of the first lead terminals 30, when viewed in the second direction perpendicular to the lower surface 10r of the base section 20 (in Y-axis direction from side facing lid member 16), are disposed in positions outside the outer circumferential edge of the base section 20, that is, in positions outside the second edge 27, and the lead end sections 34 are connected to the mounting substrate 50 via bonding members 51, for example, solder, as shown in FIG. 7.

Similarly, the fourth ends 46 of the second lead terminals 40, when viewed in the second direction (Y-axis direction), are disposed in positions outside the outer circumferential edge of the base section 20, that is, in positions outside the first edge 26, and the lead end sections 44 are connected to the mounting substrate 50 via bonding members 51, for example, solder.

The configuration in which the second ends 36 of the first lead terminals 30 and the fourth ends 46 of the second lead terminals 40 are disposed as described above and the portions including the second ends 36 and the fourth ends 46 are connected to the mounting substrate 50 via the bonding members 51 and 52 allows visual recognition of the connection states of the bonding members 51 and 52 when viewed in the second direction (in Y-axis direction from side facing lid member 16) with no interference with the lid member 16, the base section 20, or any other component. That is, the quality of the connection states can be readily checked.

According to the quartz crystal oscillator 1 as the electronic component described above, the lead sections 33 of the first lead terminals 30 and the lead section 43 of the second lead terminals 40, which are connected to the first surface (lower surface 10r) of the base section 20 as the first substrate, intersect each other in the area Q located roughly at the center in the width direction (Z-axis direction) of the base section 20 when viewed in the first direction (X-axis direction) along the lower surface 10r. Since the first lead terminals 30 and the second lead terminals 40 extend in opposite directions as described above, the intersecting first lead terminals 30 and second lead terminals 40 can be further lengthened, whereby what is called a cushioning effect of absorbing externally acting impact force or any other type of force can be sufficiently provided. The influence of the stress on the characteristics and other factors of the quartz crystal oscillator 1 can therefore be reduced.

Second Embodiment

Figure 8:
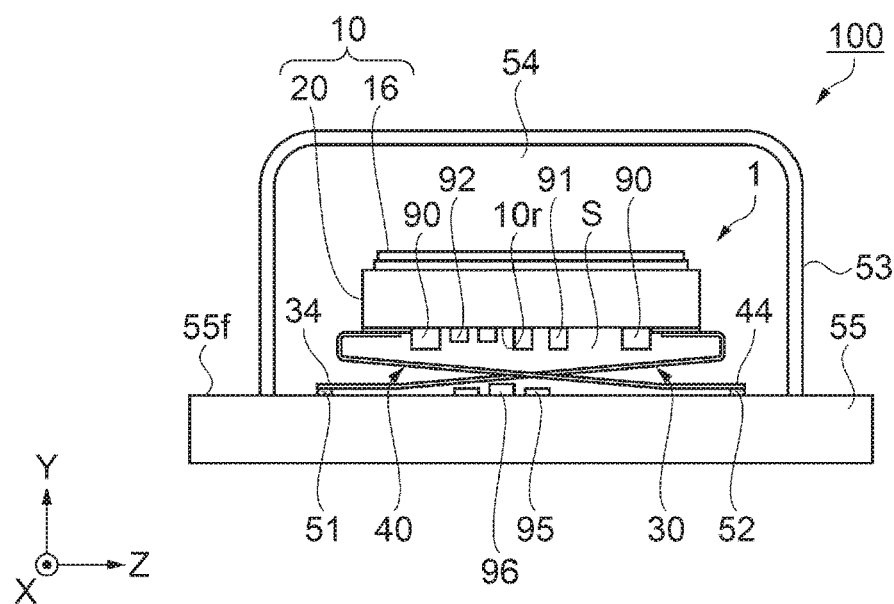
FIG. 8 is a front cross-sectional view of an oscillator according to a second embodiment of the electronic component.

As an example of an oscillator according to a second embodiment of the electronic component, an OCXO (oven controlled quartz crystal oscillator) including an SC-cut quartz crystal vibrator element is presented, and the configuration of the OCXO will be described with reference to FIG. 8. FIG. 8 is a front cross-sectional view of the oscillator according to a second embodiment of the electronic component. FIG. 8 shows a quartz crystal oscillator 100 with a cover 53 cut for ease of the description of the configuration of the quartz crystal oscillator 100. Further, the X, Y, and Z axes and the upper and lower surfaces are used also in the following description, as in the first embodiment. Wiring patterns and electrode pads formed on the upper surface of a base substrate 101 and wiring patterns, connection electrodes formed on the outer surface of the container 10, and wiring patterns and electrode pads formed in the container 10 are omitted. In the description of the present embodiment or the second embodiment, the same configurations as those in the first embodiment described above have the same reference characters and will not be described.

The quartz crystal oscillator 100 as the electronic component uses an SC-cut quartz crystal vibrator element (not shown), which excels in frequency stability because the sensitivity to external stress is low. The quartz crystal oscillator 100 includes the container 10, which accommodates an integrated circuit (not shown) including an oscillation circuit and a quartz crystal vibrator element in the internal space of the container 10, the first lead terminals 30 and the second lead terminals 40, which are connected to the lower surface 10r of the base section 20, which forms the container 10, a heat generator 90 and circuit elements 91 and 92 as elements connected to the lower surface 10r of the base section 20, and a base substrate 55, as shown in FIG. 8.

The container 10 is so disposed on the upper surface 55f of the base substrate 55 of the quartz crystal oscillator 100 via the first lead terminals 30 and the second lead terminals 40 as to be freely separate from the base substrate 55, and circuits parts 95 and 96, such as a plurality of capacitors and resistors, are disposed on the upper surface 55f. Further, the container 10, the circuit parts 95 and 96, and other components are covered with a cover 53 and accommodated in the interior 54 of the cover 53. The interior of the cover 53 may be a vacuum space, may have a reduced-pressure atmosphere having pressure, for example, lower than the atmospheric pressure, may be hermetically sealed to form nitrogen, argon, helium, or any other inert gas atmosphere, or may not be hermetically sealed.

The heat generator 90 and the circuit elements 91 and 92, which are connected to the lower surface 10r of the base section 20, which forms the container 10, are disposed in an area S surrounded by the first lead terminals 30, the second lead terminals 40, and the lower surface 10r of the base section 20 when viewed in the first direction (X-axis direction) along the lower surface 10r. The arrangement of the heat generator 90 and the circuit elements 91 and 92 described above allows effective use of the space between the first lead terminals 30/second lead terminals 40 and the lower surface 10r, whereby the element arrangement efficiency can be improved. The size of the quartz crystal oscillator 100 can therefore be reduced.

The cover 53 is preferably made of an iron-based alloy having low thermal conductivity, such as a 42 alloy (iron-nickel alloy), with nickel plated thereon.

The configuration of the container 10 containing the quartz crystal oscillator and other components accommodated in the internal space of the container 10 is the same as that in the first embodiment and will therefore not be described. Further, the configurations of the first lead terminals 30 and the second lead terminals 40 connected to the lower surface 10r of the base section 20, which forms the container 10, are also the same as those in the first embodiment and will therefore not be described.

The heat generator 90 connected to the lower surface 10r of the base section 20, which forms the container 10, is formed, for example, of a power transistor or a resistive heat generator. The heat generator 90 controls the temperature of the container 10 and reduces variation in the resonance frequency of the quartz crystal vibration element due to changes in the temperatures of the quartz crystal vibration element and the integrated circuit. The heat generator 90 can instead be disposed in the internal space in the container 10.

The base substrate 55 is made of an insulating material, such as a glass epoxy resin and a ceramic material. Wiring lines (not shown) provided on the base substrate 55 are formed by using a method for etching a substrate on the entire surface of which a copper foil is formed or a method including printing a metal wiring material, such as tungsten (W) and molybdenum (Mo), on a substrate in a screen printing process, burning the printed material, and plating nickel (Ni), gold (Au), or any other material on the burned material.

The lead end sections 34 and 44 of the first lead terminals 30 and the second lead terminals 40 that are the same as those in the first embodiment and connected to the lower surface 10r of the base section 20, which forms the container 10, are connected via the bonding members 51 and 52, such as solder, to the wiring lines (not shown) provided on the base substrate 55. In the case of OCXO (oven controlled quartz crystal oscillator) that controls the temperature of the quartz crystal vibrator element, as in the present embodiment, using an iron-based alloy having low thermal conductivity, such as a 42 alloy (iron-nickel alloy), as the material of the first lead terminals 30 and the second lead terminals 40 preferably allows the heat in the container 10 to be readily dissipated out of the container 10 via the first lead terminals 30 and the second lead terminals 40.

In the quartz crystal oscillator 100 according to the second embodiment described above, the first lead terminals 30 and the second lead terminals 40, which extend in opposite directions and intersect each other so that they can be lengthened, allow absorption and dispersion of externally acting impact force or any other stress. Therefore, even when impact or any other external force acts on the quartz crystal oscillator 100, the aforementioned stress reduction effect provided by the first lead terminals 30 and the second lead terminals 40 protects the heat generator 90, the circuit elements 91 and 92, or the quartz crystal vibrator element, whereby possibility of occurrence of breakage and other problems of the quartz crystal oscillator 100 as the electronic component can be lowered. Therefore, since the heat generator 90 can control the temperature of the quartz crystal vibrator element, variation in the resonance frequency of the quartz crystal vibrator element due to a change in the temperature thereof can be reduced, and the impact resistance characteristic of the quartz crystal vibrator element can be improved, whereby an OCXO (oven controlled quartz crystal oscillator) having improved long-term reliability of the functional characteristics can be provided.

Third Embodiment

Figure 9:
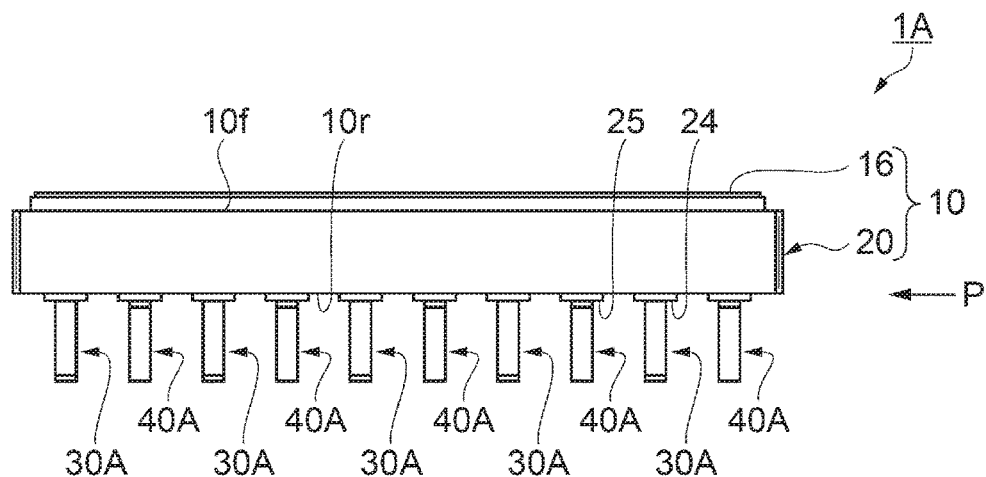
FIG. 9 is a front view of an oscillator according to a third embodiment of the electronic component.
Figure 10:
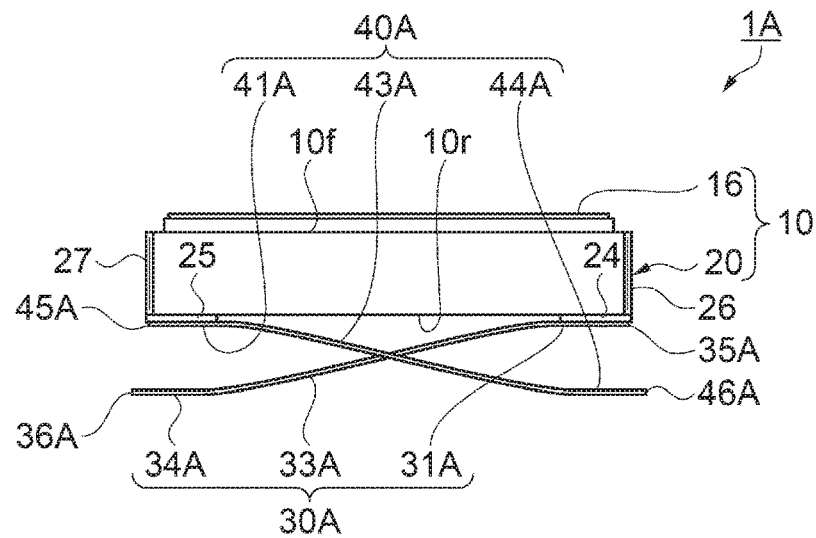
FIG. 10 is a side view of the oscillator according to the third embodiment viewed in the direction indicated by the arrow P shown in FIG. 9.
Figure 11:
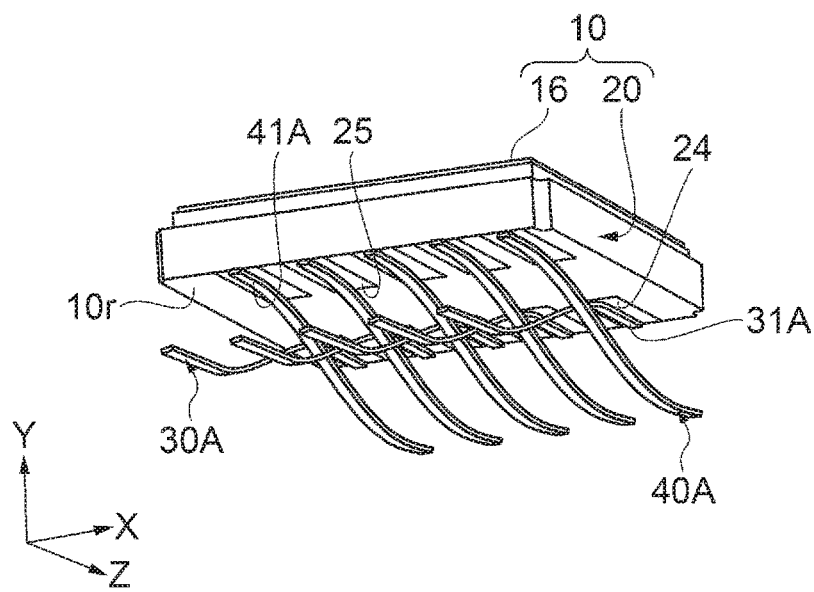
FIG. 11 is a perspective view of the oscillator according to the third embodiment viewed from the side facing the lead terminals of the oscillator.

As an example of an oscillator according to a third embodiment of the electronic component, a quartz crystal oscillator including an SC-cut quartz crystal vibrator element is presented, and the configuration of quartz crystal oscillator will be described with reference to FIGS. 9, 10, and 11. FIG. 9 is a front view of the oscillator according to the third embodiment of the electronic component. FIG. 10 is a side view of the oscillator according to the third embodiment viewed in the direction indicated by the arrow P shown in FIG. 9. FIG. 11 is a perspective view of the oscillator according to the third embodiment viewed from the side facing the lead terminals of the oscillator. The X, Y, and Z axes and the upper and lower surfaces are used also in the following description, as in the first embodiment.

In a quartz crystal oscillator 1A according to the present embodiment of the third embodiment, the configurations of first lead terminals 30A and second lead terminals 40A differ from those of the first lead terminals 30 and second lead terminals 40 of the quartz crystal oscillator 1 according to the first embodiment described above but the configurations of the other portions are the same as those in the first embodiment. The description of the third embodiment will therefore be made primarily of the configurations of the first lead terminals 30A and the second lead terminals 40A, which differ from those in the first embodiment, and the same configurations as those in the first embodiment have the same reference characters in the following description and will not be described. Further, the method for forming the first lead terminals 30A and the second lead terminals 40A is the same as the method in the first embodiment described above and will therefore not be described.

The quartz crystal oscillator 1A as the oscillator according to the third embodiment includes the container 10, which is formed of the base section 20 and the lid member 16 connected to the upper surface 10f of the base section 20, and the first lead terminals 30A and the second lead terminals 40A, which are a plurality of lead terminals connected to the first connection terminals 24 and the second connection terminals 25 provided on the lower surface 10r of the base section 20, as shown in FIGS. 9, 10, and 11. Also in the present embodiment, the base section 20 corresponds to the first substrate, and the lower surface 10r of the base section 20 (lower surface of container 10) corresponds to the first surface. The lower surface 10r of the base section 20 is a surface that is part of the base section 20 and opposite the side to which the lid member 16 is connected and can also be called the lower surface of the container 10.

The base section 20, which forms the container 10, the lid member 16, the integrated circuit 19 (see FIG. 4) and the quartz crystal vibrator element 17 (see FIG. 4), which are accommodated in the container 10, have the same configurations as those in the first embodiment and will not therefore be described.

The lower surface 10r of the base section 20 is provided with the first connection terminals 24 and the second connection terminals 25 electrically continuous with, for example, the quartz crystal vibrator element 17 (see FIG. 4) and the integrated circuit 19 (see FIG. 4) via the internal wiring (not shown). The lower surface 10r of the base section has the first edge 26, which is located on the +Z-axis-direction side, and the second edge 27, which is located on the −Z-axis-direction side and faces the first edge 26. Five first connection terminals 24 are arranged at predetermined intervals along the first edge 26 and on the side facing the first edge 26, and five second connection terminals 25 are arranged at predetermined intervals along the second edge 27 and on the side facing the second edge 27. In other words, the first connection terminals 24 are provided in an area that is part of the lower surface 10r and closer to the first edge 26 than to the second edge 27, and the second connection terminals 25 are provided in an area that is part of the lower surface 10r and closer to the second edge 27 than to the first edge 26.

The numbers of first connection terminals 24 and second connection terminals 25 are not limited to specific numbers and may be any numbers. The first connection terminals 24 and the second connection terminals 25 can be formed, for example, by using a method including printing a metal wiring material, such as tungsten (W) and molybdenum (Mo), on the lower surface of the base section 20 in a screen printing process, burning the printed material, and plating nickel (Ni), gold (Au), or any other substance on the burned material.

The first lead terminals 30A are connected to the first connection terminals 24, and the second lead terminals 40A are connected to second connection terminals 25. The connection between the first connection terminals 24 and the first lead terminals 30A and the connection between the second connection terminals 25 and the second lead terminals 40A are preferably made, for example, by using solder or any other electrically conductive bonding members.

The first lead terminals 30A each include a connection pad 31A, which is connected to the corresponding first connection terminal 24 via the bonding member (not shown), a lead sections 33A, which extends from the connection pad 31A, and a lead end sections 34A, which extends from the lead section 33A, as shown in FIG. 10. The first lead terminals 30A further each have a first end 35A, which is an end on the side facing the connection pad 31A, and a second end 36A, which is an end opposite the first end 35A and is located on the side facing the lead end section 34A.

In detail, the connection pads 31A, which have the first ends 35A, are connected to the first connection terminals 24 and extend from the first ends 34A toward the inner side of the base section 20 (in −Z-axis direction). That is, the first lead terminals 30A are so configured that the connection pads 31A having the first ends 35A are connected to the first connection terminals 24 located in the area that is part of the lower surface 10r of the base section 20 and closer to the first edge 26 than to the second edge 27.

The lead sections 33A are each a portion that is bent with respect to the connection pad 31A and extends toward the second edge 27 (in −Z-axis direction) obliquely with respect to the −Z-axis and −Y-axis directions with the distance between the lead section 33A and the lower surface 10r of the base section 20 increasing with distance from the connection pad 31A. The lead sections 33A in the present embodiment are each a roughly linear portion and may each have a curved portion, a bent portion, or any other portion. The lead end sections 34A are each a portion connected to a mounting substrate (not shown) or any other component, for example, in a soldering process, the lead end sections 34A are so bent in the vicinity of the ends of the lead sections 33A as to be parallel to the mounting substrate and have the second ends 36A, which are the ends opposite the first ends 35A, which are one-side ends of the first lead terminals 30A.

Since the connection pads 31A, which have the first ends 35A of the first lead terminals 30A, are connected to the first connection terminals 24, which are located in the area that is part of the lower surface 10r of the base section 20 and close to the first edge 26, and the lead sections 33A extend toward the second edge 27, which faces the first edge 26, as described above, the first lead terminals 30A can be further lengthened, whereby what is called a cushioning effect of absorbing externally acting impact force or any other type of force can be enhanced.

The second ends 36A of the first lead terminals 30A are preferably disposed as to be separate outward from the outer circumferential edge of the base section 20 when viewed in the second direction (Y-axis direction) perpendicular to the lower surface 10r of the base section 20. The arrangement of the second ends 36A of the first lead terminals 30A readily allows visual recognition, in the second direction, of the state of the second ends 36A, for example, the state of connection between the second ends 36A and the mounting substrate (not shown).

The second lead terminals 40A each include a connection pad 41A, which is connected to the corresponding second connection terminal 25 via the bonding member (not shown), a lead section 43A, which extends from the connection pad 41A, and a lead end section 44A, which extends from the lead section 43A, as shown in FIG. 10. The second lead terminals 40A further each have a third end 45A, which is an end facing the connection pad 41, and a fourth end 46A, which is an end opposite the third end 45A and is located on the side facing the lead end section 44A.

In detail, the connection pads 41A, which have the third ends 45A, are connected to the second connection terminals 25 and extend from the third ends 45A toward the inner side of the base section 20 (in +Z-axis direction). That is, the second lead terminals 40A are so configured that the connection pads 41A having the third ends 45A are connected to the second connection terminals 25, which are located in the area that is part of the lower surface 10r of the base section 20 and closer to the second edge 27 than to the first edge 26.

The lead sections 43A are each a portion that is bent with respect to the connection pad 41A and extends toward the first edge 26 (in +Z-axis direction) obliquely with respect to the +Z-axis and −Y-axis directions with the distance between the lead section 43A and the lower surface 10r of the base section 20 increasing with distance from the connection pad 41A. The lead sections 43A in the present embodiment are each a roughly linear portion and may each have a curved portion and a bent portion. The lead end sections 44A are each a portion connected to the mounting substrate (not shown) or any other component, for example, in a soldering process, and the lead end sections 44A are so bent in the vicinity of the ends of the lead sections 43A as to be parallel to the mounting substrate and have the fourth ends 46A, which are the ends opposite the third ends 45A, which are one-side ends of the second lead terminals 40A.

Since the third ends 45A of the second lead terminals 40A are connected to the second connection terminals 25, which are located in the area that is part of the lower surface 10r of the base section 20 and close to the second edge 27, and the lead sections 43A extend toward the first edge 26, which faces the second edge 27, as described above, the second lead terminals 40A can be further lengthened, whereby what is called a cushioning effect of absorbing externally acting impact force or any other type of force can be enhanced.

The fourth ends 46A of the second lead terminals 40A are preferably so disposed as to be separate outward from the outer circumferential edge of the base section 20 when viewed in the second direction (Y-axis direction) perpendicular to the lower surface 10r of the base section 20. The arrangement of the fourth ends 46A of the second lead terminals 40A readily allows visual recognition, in the second direction, of the state of the fourth ends 46A, for example, the state of connection between the fourth ends 46A and the mounting substrate (not shown).

The first lead terminals 30A and the second lead terminals 40A are so disposed in a staggered configuration (alternately disposed). The first ends 35A of the first lead terminals 30A and the third ends 45A of the second lead terminals 40A are so disposed as to be oriented in opposite directions. In the present embodiment, the first ends 35A are oriented in the +Z-axis direction, and the third ends 45A are oriented in the −Z-axis direction. When the thus disposed first lead terminals 30A and second lead terminals 40A are viewed in the first direction (X-axis direction) along the lower surface 10r of the base section 20, the lead sections 33A of the first lead terminals 30A and the lead sections 43A of the second lead terminals 40A intersect each other in an area located roughly at the center in the width direction of the base section 20 (Z-axis direction). Since the first lead terminals 30A and the second lead terminals 40A extend in opposite directions as described above, the intersecting first lead terminals 30A and second lead terminals 40A can be further lengthened, whereby what is called a cushioning effect of absorbing externally acting impact force or any other type of force can be sufficiently provided.

The first lead terminals 30A and the second lead terminals 40A preferably do not overlap with each other when viewed in the second direction (Y-axis direction) perpendicular to the lower surface 10r of the base section 20. The arrangement of the first lead terminals 30A and the second lead terminals 40A allows reduction in the risk of contact between the first lead terminals 30A and the second lead terminals 40A.

The first lead terminals 30A and the second lead terminals 40A each have a plate-like shape that is narrow in the X-axis direction when viewed in the Z-axis direction, and the bent portions of the lead sections 33A and 43A and the lead end sections 34A and 44A are preferably bent in the thickness direction of the lead sections and the lead end sections, which is a direction that intersects the X-axis direction, whereby the cushioning effect is more readily provided.

The lead sections 33A and 43A are preferably configured to incline by an angle greater than or equal to 1° but smaller than or equal to 30° with respect to the mounting substrate (not shown) as the second substrate on which the quartz crystal oscillator 1A is mounted as in the first embodiment. The inclination of the lead sections 33A and 43A by the angle described above allows the cushioning effect of absorbing impact or any other type of stress to be further enhanced. The angle between the lead sections 33A, 43A and the mounting substrate is more preferably greater than or equal to 3° but smaller than or equal to 10°. In this case, the quartz crystal oscillator 1A can be thinner, and the deformation of the lead sections 33A or 43A can further enhance the cushioning effect of absorbing impact or any other type of stress.

The first lead terminals 30A and the second lead terminals 40A are each preferably formed of a plate made of a material having high electric conductivity and relatively good formability, such as a 42 alloy (iron-nickel alloy) and a copper alloy, with nickel plating or any other surface treatment provided on the plate, as in the first embodiment.

In the quartz crystal oscillator 1A according to the third embodiment described above, the lead sections 33A of the first lead terminals 30A and the lead section 43A of the second lead terminals 40A, which are connected to the first surface (lower surface 10r) of the base section 20 as the first substrate and extend in opposite directions, intersect each other in an area located roughly at the center in the width direction (Z-axis direction) of the base section 20 when viewed in the first direction (X-axis direction) along the lower surface 10r. Since the first lead terminals 30A and the second lead terminals 40A extend in opposite directions as described above, the intersecting first lead terminals 30A and second lead terminals 40A can be further lengthened, whereby what is called a cushioning effect of absorbing externally acting impact force or any other type of force can be sufficiently provided. The influence of the stress on the characteristics and other factors of the quartz crystal oscillator 1A can therefore be reduced.

Fourth Embodiment

Figure 12:
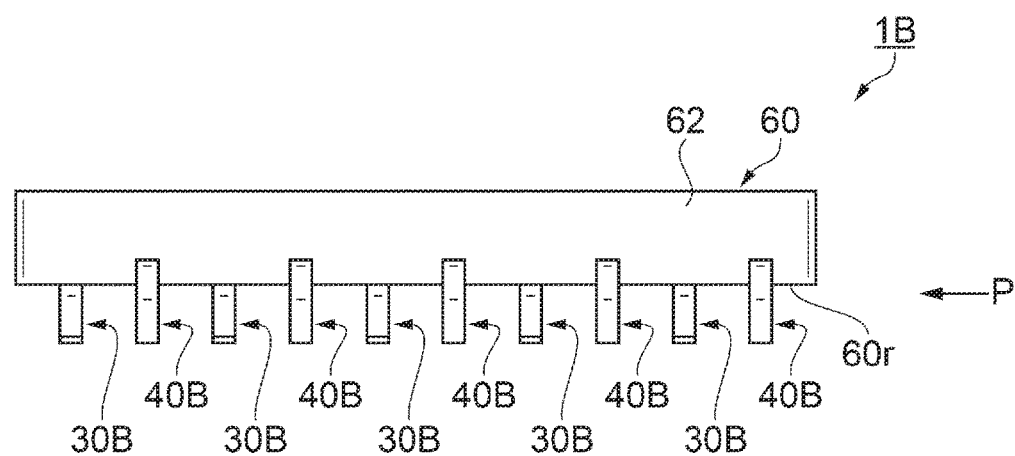
FIG. 12 is a front view of an oscillator according to a fourth embodiment of the electronic component.
Figure 13:
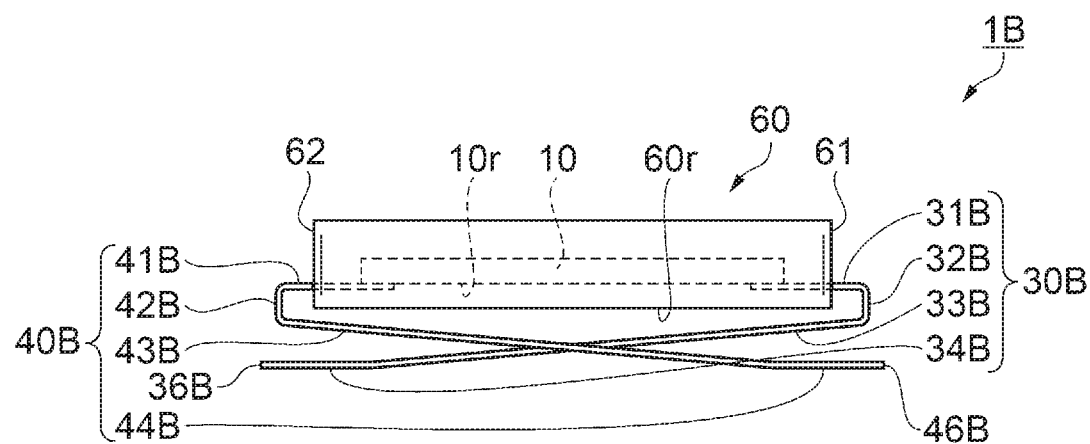
FIG. 13 is a side view of the oscillator according to the fourth embodiment viewed in the direction indicated by the arrow P shown in FIG. 12.
Figure 14:
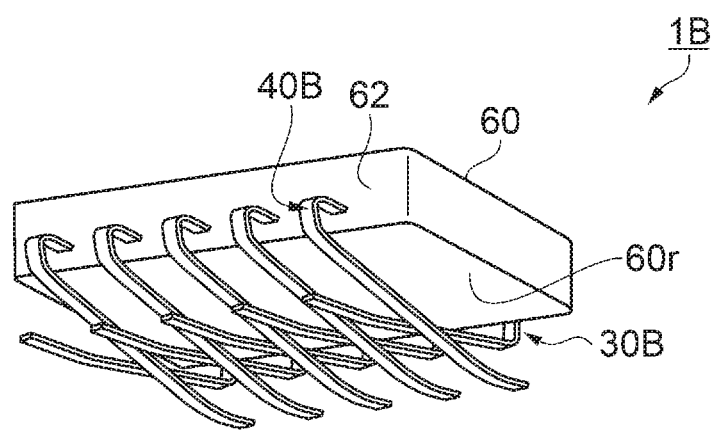
FIG. 14 is a perspective view of the oscillator according to the fourth embodiment viewed from the side facing the lead terminals of the oscillator.

As an example of an oscillator according to a fourth embodiment of the electronic component, a quartz crystal oscillator including an SC-cut quartz crystal vibrator element is presented, and the configuration of quartz crystal oscillator will be described with reference to FIGS. 12, 13, and 14. FIG. 12 is a front view of the oscillator according to the fourth embodiment of the electronic component. FIG. 13 is a side view of the oscillator according to the fourth embodiment viewed in the direction indicated by the arrow P shown in FIG. 12. FIG. 14 is a perspective view of the oscillator according to the fourth embodiment viewed from the side facing the lead terminals of the oscillator. The X, Y, and Z axes and the upper and lower surfaces are used also in the following description, as in the first embodiment.

A quartz crystal oscillator 1B according to the present embodiment of the fourth embodiment has a configuration in which the container 10, which accommodates a quartz crystal vibrator element (not shown) and other components, and the portion where first lead terminals 30B and second lead terminals 40B are connected to the lower surface 10r of the container 10 are enclosed in a second container (package) 60, for example, in a resin molding process, as shown in FIGS. 12, 13 and 14. In the present configuration, the first lead terminals 30B and the second lead terminals 40B protrude out of the second container 60 through two Z-axis-direction side surfaces 61 and 62 of the second container 60. The container 10, the first and second connection terminals (not shown) provided on the lower surface 10r, the quartz crystal vibrator element (not shown) accommodated in the container 10, and other components are the same as those in the first embodiment and will not therefore be described.

Further, the method for forming the first lead terminals 30B and the second lead terminals 40B is the same as the method in the first embodiment described above and will not therefore be described. Also in the present embodiment, the base section 20 (see FIG. 4), which forms the container 10, corresponds to the first substrate, and the lower surface 10r of the base section 20 (lower surface of container 10) corresponds to the first surface.

The first lead terminals 30B are connected to the first connection terminals that are not shown, and the second lead terminals 40B are connected to the second connection terminals that are not shown. The container 10 containing the portions where the components described above are connected to each other is accommodated in the second container made, for example, of a molding resin.

The first lead terminals 30B each includes a connection pad 31B, which is connected to the container 10 and protrudes in the +Z-axis direction through the side surface (first edge) 61 of the second container 60, a bent section 32B, which is bent at the protruding portion extending from the connection pad 31B, a lead section 33B, which is bent with respect to the bent section 32B and extends toward the side surface (second edge) 62 (in −Z-axis direction), which is opposite the side surface 61, obliquely with respect to the −Z-axis and −Y-axis directions with the distance between the lead section 33B and the lower surface 60r of the second container 60 increasing with distance from the bent section 32B, a lead end section 34B, which extends from the lead section 33B, and a second end 36B, which is located on the side facing the lead end section 34B, as shown in FIG. 13.

Since the first lead terminals 30B protrude through the side surface (first edge) 61 of the second container 60, and the lead sections 33B extend toward the side surface 62 (second edge), which faces the side surface (first edge) 61, as described above, the first lead terminals 30B can be further lengthened, whereby what is called a cushioning effect of absorbing externally acting impact force or any other type of force can be enhanced.

The second ends 36B of the first lead terminals 30B are preferably so disposed as to be separate outward from the outer circumferential edge of the second container 60 when viewed in the second direction (Y-axis direction) perpendicular to the lower surface 60r of the second container 60. The arrangement of the second ends 36B of the first lead terminals 30B readily allows visual recognition, in the second direction, of the state of the second ends 36B, for example, the state of connection between the second ends 36B and a mounting substrate (not shown).

The second lead terminals 40B each include a connection pad 41B, which is connected to the container 10 and protrude in the −Z-axis direction through the side surface (second edge) 62 of the second container 60, a bent section 42B, which is bent at the protruding portion extending from the connection pad 41B, a lead section 43B, which is bent with respect to the bent section 42B and extends toward the side surface (first edge) 61 (in +Z-axis direction), which is opposite the side surface 62, obliquely with respect to the +Z-axis and −Y-axis directions with the distance between the lead section 43B and the lower surface 60r of the second container 60 increasing with distance from the bent section 42B, a lead end section 44B, which extends from the lead section 43B, and a second end 46B, which is located on the side facing the lead end section 44B.

Since the second lead terminals 40B protrude through the side surface 62 (second edge) of the second container 60, and the lead sections 43B extend toward the side surface 61 (first edge), which faces the side surface 62 (second edge), as described above, the second lead terminals 40B can be further lengthened, whereby what is called a cushioning effect of absorbing externally acting impact force or any other type of force can be enhanced.

The second ends 46B of the second lead terminals 40B are preferably so disposed as to be separate outward from the outer circumferential edge of the second container 60 when viewed in the second direction (Y-axis direction) perpendicular to the lower surface 60r of the second container 60. The arrangement of the second ends 46B of the second lead terminals 40B readily allows visual recognition, in the second direction, of the state of the second ends 46B, for example, the state of connection between the second ends 46B and the mounting substrate (not shown).

The first lead terminals 30B and the second lead terminals 40B are so disposed in a staggered configuration (alternately disposed). The directions in which the first lead terminals 30B and the second lead terminals 40B protrude from the second container 60 are so set as to be oriented in opposite directions. The lead sections 33B of the first lead terminals 30B and the lead sections 43B of the second lead terminals 40B intersect each other in an area located roughly at the center in the width direction of the second container 60 (Z-axis direction) when viewed in the first direction (X-axis direction) along the lower surface 60r of the second container 60. Since the first lead terminals 30B and the second lead terminals 40B extend in opposite directions as described above, the intersecting first lead terminals 30B and second lead terminals 40B can be further lengthened, whereby what is called a cushioning effect of absorbing externally acting impact force or any other type of force can be sufficiently provided.

The first lead terminals 30B and the second lead terminals 40B preferably do not overlap with each other when viewed in the second direction (Y-axis direction) perpendicular to the lower surface 60r of the second container 60. The arrangement of the first lead terminals 30B and the second lead terminals 40B allows reduction in the risk of contact between the first lead terminals 30B and the second lead terminals 40B.

The first lead terminals 30B and the second lead terminals 40B each have a plate-like shape that is narrow in the X-axis direction when viewed in the Z-axis direction, and the bent sections 32B and 42B and the bent portions of the lead sections 33B and 43B are preferably bent in the thickness direction of the bent sections and the lead sections, which is a direction that intersects the X-axis direction, whereby the cushioning effect is more readily provided.

The lead sections 33B and 43B are preferably configured to incline by an angle greater than or equal to 1° but smaller than or equal to 30° with respect to the mounting substrate (not shown) as the second substrate on which the quartz crystal oscillator 1B is mounted. The inclination of the lead sections 33B and 43B by the angle described above allows the cushioning effect of absorbing impact or any other type of stress to be further enhanced. The angle between the lead sections 33B, 43B and the mounting substrate is more preferably greater than or equal to 3° but smaller than or equal to 10°. In this case, the quartz crystal oscillator 1B can be thinner, and the deformation of the lead sections 33B or 43B can further enhance the cushioning effect of absorbing impact or any other type of stress.

The first lead terminals 30B and the second lead terminals 40B are each preferably formed of a plate made of a material having high electric conductivity and relatively good formability, such as a 42 alloy (iron-nickel alloy) and a copper alloy, with solder plating, nickel plating, or any other surface treatment provided on the plate.

In the quartz crystal oscillator 1B according to the fourth embodiment described above, the lead sections 33B of the first lead terminals 30B and the lead section 43B of the second lead terminals 40B, which are connected to the first surface (lower surface 10r) of the container 10 and extend in opposite directions, intersect each other in an area located roughly at the center in the width direction of the second container 60 (Z-axis direction) when viewed in the first direction (X-axis direction) along the lower surface 60r of the second container 60, in which the quartz crystal oscillator 1B is accommodated. Since the first lead terminals 30B and the second lead terminals 40B extend in opposite directions as described above, the intersecting first lead terminals 30B and second lead terminals 40B can be further lengthened, whereby what is called a cushioning effect of absorbing externally acting impact force or any other type of force can be sufficiently provided. The influence of the stress on the characteristics and other factors of the quartz crystal oscillator 1B can therefore be reduced.

Variation

Figure 15:
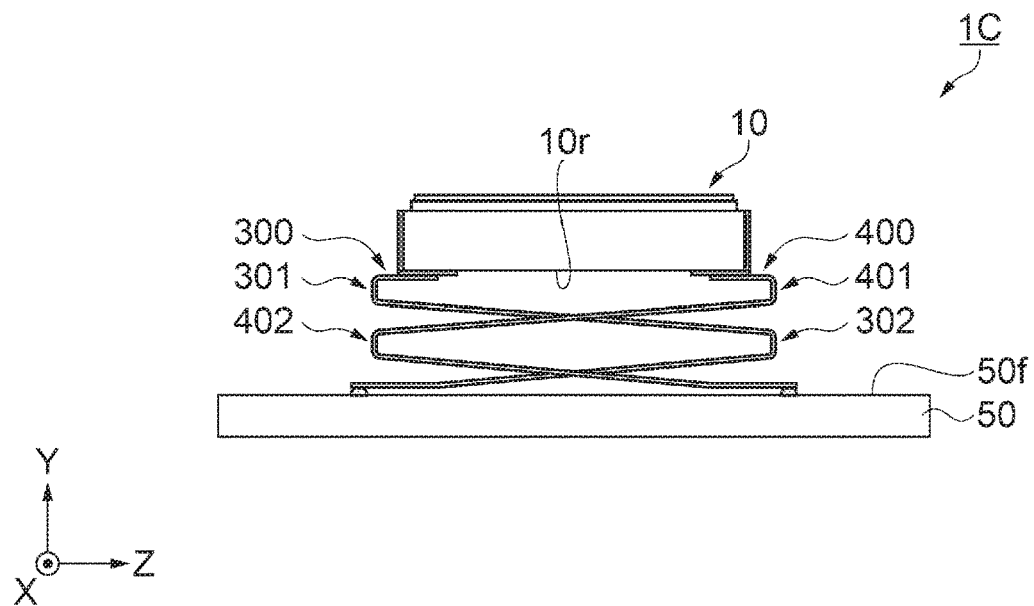
FIG. 15 is a front view of an oscillator according to a variation of the electronic component.

A quartz crystal oscillator according to a variation will next be described with reference to FIG. 15. FIG. 15 is a front view of the oscillator according to the variation of the electronic component. In the following description, the same configurations as those in the embodiments described above have the same reference characters and will not be described.

A quartz crystal oscillator 1C according to the variation differs from the quartz crystal oscillators described above in terms of the shape of the lead terminals connected to the container 10. The quartz crystal oscillator 1C includes first lead terminals 300 and second lead terminals 400, which are connected to the lower surface 10r, which serves as the first surface, of the container 10, which serves as the first substrate, as shown in FIG. 15. The first lead terminals 300 and the second lead terminals 400 in the present variation each have two folded sections. The first lead terminals 300 each have a first folded section 301 and a second folded section 302, and the second lead terminals 400 each have a first folded section 401 and a second folded section 402.

The lead section between the first folded section 301 and the second folded section 302 and the lead section between the first folded section 401 and the second folded section 402 intersect with each other in an area located roughly at the center in the width direction of the container 10 (Z-axis direction) when viewed in the first direction (X-axis direction) along the lower surface 10r of the container 10. In addition, the lead section between the second folded section 302 and a lead end section connected to the mounting substrate 50 and the lead section between the second folded section 402 and a lead end section connected to the mounting substrate 50 intersect with each other in an area located roughly at the center in the width direction of the container 10 (Z-axis direction) when viewed in the first direction (X-axis direction) along the lower surface 10r of the container 10. The first lead terminals 300 and the second lead terminals 400 of the quartz crystal oscillator 1C thus intersect each other at the two locations of the lead sections.

Also in the quartz crystal oscillator 1C, in which the first lead terminals 300 and the second lead terminals 400 each have the two folded sections, the intersecting first lead terminals 300 and second lead terminals 400 can be further longer than in the first embodiment, whereby what is called a cushioning effect of absorbing externally acting impact force or any other type of force can be sufficiently provided.

The influence of the stress on the characteristics and other factors of the quartz crystal oscillator 1C can therefore be reduced.

Application Example

Figure 16:
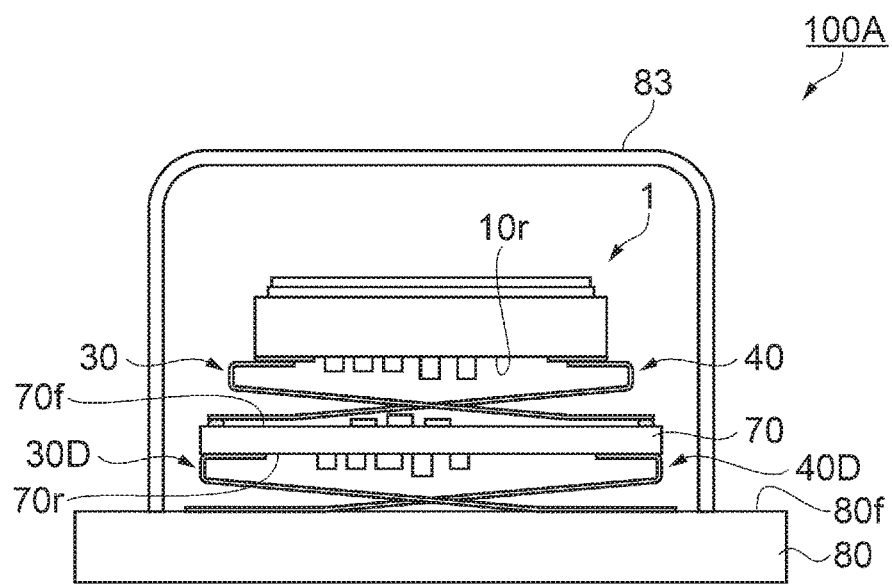
FIG. 16 is a front cross-sectional view of an oscillator according to an application example of the electronic component.

A quartz crystal oscillator according to an application example of the electronic component will next be described with reference to FIG. 16. FIG. 16 is a front cross-sectional view of the oscillator according to the application example of the electronic component. In the following description, the same configurations as those in the first and second embodiments described above have the same reference characters and will not be described.

A quartz crystal oscillator 100A according to the application example includes the quartz crystal oscillator 1 described in the first embodiment, a mounting substrate 70, to which the quartz crystal oscillator 1 is connected via the first lead terminals 30 and the second lead terminals 40, and a base substrate 80, to which the mounting substrate 70 is connected via third lead terminals 30D and fourth lead terminals 40D. The quartz crystal oscillator 1 includes the first lead terminals 30 and the second lead terminals 40 connected to the lower surface 10r, as the first surface, of the container, which serves as the first substrate. The quartz crystal oscillator 1, the first lead terminals 30 and the second lead terminals 40, the mounting substrate 70, and the third lead terminals 30D and the fourth lead terminals 40D are covered with a cover 83, which is connected to an upper surface 80f of the base substrate 80 and accommodated in the cover 83. The interior of the cover 83 may be a vacuum space, may have a reduced-pressure atmosphere having pressure lower than the atmospheric pressure, may be hermetically sealed to form nitrogen, argon, helium, or any other inert gas atmosphere, or may not be hermetically sealed.

The third lead terminals 30D and fourth lead terminals 40D each having a folded section extend in opposite directions, as the first lead terminals 30 and the second lead terminals 40 do. In the present configuration, it can also be said that the mounting substrate 70 functions as the first substrate, and that a lower surface 70r of the mounting substrate 70 functions as the first surface. In this case, the third lead terminals 30D and fourth lead terminals 40D function as the first lead terminals and the second lead terminals.

Also in the thus configured quartz crystal oscillator 100A, the intersecting first lead terminals 30 and second lead terminals 40 and the intersect third lead terminals 30D and fourth lead terminals 40D, which are further provided, allow what is called a cushioning effect of absorbing externally acting impact force or any other type of force to be sufficiently provided. The influence of the stress on the characteristics and other factors of the quartz crystal oscillator 100A can therefore be reduced.

The quartz crystal vibrator element 17 presented by way of example in the embodiments, the variation, and the application example described above is an SC-cut quartz crystal vibrator element having a rectangular shape as an example, but not necessarily. The quartz crystal vibrator element 17 may instead be an SC-cut quartz crystal vibrator element having a circular shape or an AT-cut quartz crystal vibrator element having a rectangular or circular shape or may still instead be a tuning-fork-type quartz crystal oscillator, a surface-acoustic-wave resonator element, or any other piezoelectric vibrator or a MEMS (micro electro mechanical system) resonator element. Further, the substrate of the vibrator element described above is not necessarily made of quartz crystal and may be made, for example, of lithium tantalate, lithium niobate, or any other piezoelectric single crystal, a piezoelectric material, such as lead zirconium titanate or any other piezoelectric ceramic material, or a silicon semiconductor material. The vibrator element described above may be excited by using a piezoelectric effect or electrostatically driven based on Coulomb force.

The aforementioned embodiments have been described with reference to the quartz crystal oscillators 1, 1A, 1B, 1C, 100, and 100A using the quartz crystal vibrator element 17 as examples of the electronic component according to an embodiment of the invention, but not necessarily. For example, the invention is applicable to an electronic component having another function, such as a sensor including a built-in sensor element that detects acceleration, angular velocity, or any other physical quantity.

Electronic Apparatus

Figure 17:
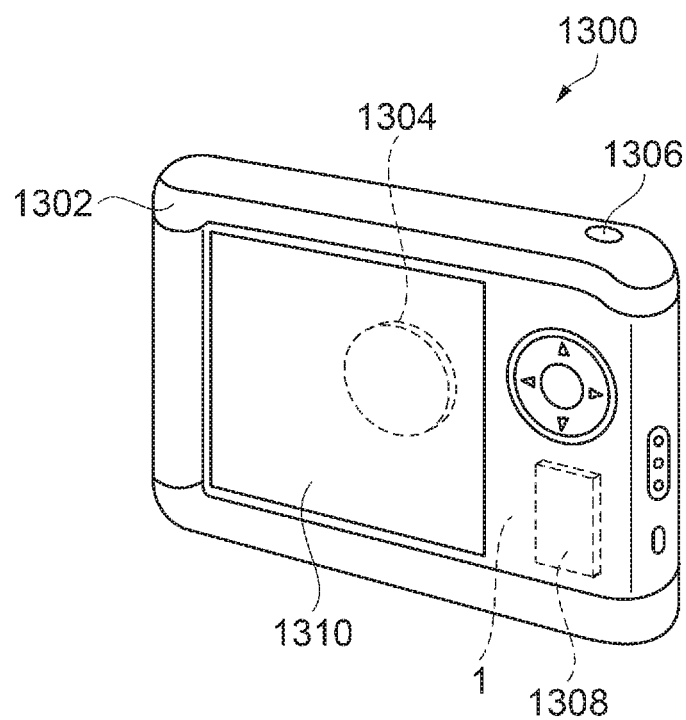
FIG. 17 is a perspective view showing a digital still camera as the electronic apparatus.

An electronic apparatus including any of the quartz crystal oscillators 1, 1A, 1B, 1C, 100, and 100A will next be described with reference to a digital still camera shown in FIG. 17. FIG. 17 is a perspective view showing a digital still camera as the electronic apparatus. The following description will be made with reference to a case where the quartz crystal oscillator 1 is used.

As shown in FIG. 17, a display 1310 is provided on the rear side of a case (body) 1302 of a digital still camera 1300 and performs display operation based on a captured image signal from a CCD. The display 1310 thus functions as a finder that displays a subject in the form of an electronic image. Further, a light receiving unit 1304 including an optical lens (imaging system), the CCD, and other components is provided on the front side (rear side in FIG. 17) of the case 1302. When a user who uses the camera for photography checks a subject image displayed on the display 1310 and presses a shutter button 1306, a captured image signal from the CCD at that point of time is transferred to and stored in a memory 1308. The quartz crystal oscillator 1 is built in the thus configured digital still camera 1300.

The digital still camera 1300 described above as the electronic apparatus, which includes the quartz crystal oscillator 1, can provide the effects provided by the quartz crystal oscillator 1 described above and therefore achieve excellent reliability, in particular, an excellent temperature characteristic.

The electronic apparatus is not limited to the digital still camera 1300 shown in FIG. 17 and can, for example, be a personal computer, a mobile phone, a smartphone, a tablet terminal, a timepiece (including smartwatch), an inkjet-type liquid ejection apparatus (inkjet printer, for example), a laptop personal computer, a television receiver, an HMD (head mounted display) and other wearable terminals, a video camcorder, a video tape recorder, a car navigator, a pager, an electronic notebook (including electronic notebook having communication capability), an electronic dictionary, a desktop calculator, an electronic game console, a word processor, a workstation, a TV phone, a security television monitor, electronic binoculars, a POS terminal, a medical apparatus (for example, electronic thermometer, blood pressure gauge, blood sugar meter, electrocardiograph, ultrasonic diagnostic apparatus, and electronic endoscope), a fish finder, a variety of measuring apparatus, an apparatus for a mobile terminal/base station, a variety of instruments (for example, instruments in vehicles, airplanes, and ships), a flight simulator, a network server, a head mounted display, a motion tracer, a motion tracker, a motion controller, a PDR (pedestrian dead reckoning) apparatus, or any other electronic apparatus. Any of the quartz crystal oscillators 1, 1A, 1B, 1C, 100, and 100A described above can be used to maintain a constant temperature state and is therefore suitable for an electronic apparatus used under a harsh temperature environment condition, such as a communication base station.

The quartz crystal oscillators 1, 1A, 1B, 1C, 100, and 100A can also be used in a vehicle. The following description will be made with reference to the case where the quartz crystal oscillator 1 is used. Specifically, the following description will be made with reference to a case where the quartz crystal oscillator 1 is used in an automobile as an example of the vehicle.

The automobile incorporates an electronic control unit (ECU) in which the quartz crystal oscillator 1 is built in and which controls the attitude of the automobile body and the output of the engine. In addition, the quartz crystal oscillator 1 can be widely used with an automobile body attitude control unit, an anti-lock braking system (ABS), an airbag, and a tire pressure monitoring system (TPMS).

The attitude control using the built-in quartz crystal oscillator 1 can further be used, for example, in a robot apparatus, such as a bipedal walking robot, and a radio-controlled helicopter, which can be presented as other examples of the vehicle.

The vehicle described above uses the quartz crystal oscillator 1 that maintains a constant temperature state and can therefore achieve high reliability even when used under a condition in which the vehicle is used in a harsh temperature environment.

The aforementioned embodiments have been described with reference to the configuration in which the quartz crystal vibrator element 17 is used as the vibrator, but the vibrator is not limited to the quartz crystal vibrator element 17, and a piezoelectric vibrator using an oxide substrate made, for example, of aluminum nitride (AlN), lithium niobate (LiNbO$_3$), lithium tantalate (LiTaO$_3$), lead zirconate titanate (PZT), lithium tetraborate (Li$_2$B$_4$O$_7$), langasite crystal (La$_3$Ga$_5$SiO$_{14}$), potassium niobate (KNbO$_3$), gallium phosphate (GaPO$_4$), gallium arsenide (GaAs), zinc oxide (ZnO, Zn$_2$O$_3$), barium titanate (BaTiO$_3$), lead titanate (PbPO$_3$), sodium potassium niobate ((K,Na)NbO$_3$), bismuth ferrite (BiFeO$_3$), sodium niobate (NaNbO$_3$), bismuth titanate (Bi$_4$Ti$_3$O$_{12}$), or bismuth sodium titanate (Na$_{0.5}$Bi$_{0.5}$TiO$_3$), a laminate piezoelectric substrate formed by layering aluminum nitride, tantalum pentoxide (Ta$_2$O$_5$), or any other piezoelectric material on a glass substrate, or a piezoelectric ceramic material can be used. Further, a vibrator formed of a piezoelectric element disposed on a silicon substrate can also be used. The quartz crystal vibrator is not limited to an SC-cut vibrator and may, for example, be an AT-cut, BT-cut, Z-cut, or LT-cut vibrator.

The embodiments described above have been presented by way of example, and the invention is not limited thereto. For example, the embodiments, the application example, and the variation can be combined with each other as appropriate.

The invention encompasses substantially the same configuration as the configuration described in each of the embodiments (for example, a configuration having the same function, using the same method, and providing the same result or a configuration having the same purpose and providing the same effect). Further, the invention encompasses a configuration in which an inessential portion of the configuration described in each of the embodiments is replaced. Moreover, the invention encompasses a configuration that provides the same advantageous effects as those provided by the configuration described in each of the embodiments or a configuration that can achieve the same purpose as that achieved by the configuration described in each of the embodiments. Further, the invention encompasses a configuration in which a known technology is added to the configuration described in each of the embodiments.

The entire disclosure of Japanese Patent Application No. 2017-105373, filed May 29, 2017 is expressly incorporated by reference herein.

What is claimed is:

1. An electronic component comprising:
   a first substrate having a first surface;
   a first lead terminal connected to the first surface; and
   a second lead terminal connected to the first surface,
   wherein the first lead terminal and the second lead terminal intersect each other when viewed in a first direction along the first surface,
   the first lead terminal and the second lead terminal do not overlap with each other when viewed in a second direction perpendicular to the first surface, and
   a crossing point of the first and second lead terminals is aligned with the substrate in the second direction.

2. The electronic component according to claim 1, further comprising:
   a second substrate,
   wherein the first lead terminal has a first end connected to the first surface and a second end connected to the second substrate, and
   the second end is so disposed as to be separate outward from the first substrate when viewed in the second direction.

3. The electronic component according to claim 2,
   wherein the second lead terminal has a third end connected to the first surface and a fourth end connected to the second substrate, and
   the fourth end is so disposed as to be separate outward from the first substrate when viewed in the second direction.

4. The electronic component according to claim 1,
   wherein the first surface has a first edge and a second edge facing the first edge,
   the first lead terminal has a first end connected to an area that is part of the first surface and closer to the first edge than to the second edge, and
   the second lead terminal has a third end connected to an area that is part of the first surface and closer to the second edge than to the first edge.

5. The electronic component according to claim 4, wherein the first and the third end are so disposed as to be oriented in opposite directions.

6. The electronic component according to claim 1, further comprising:
   an element disposed in an area surrounded by the first lead terminal, the second lead terminal, and the first surface when viewed in the first direction.

7. An electronic component comprising:
   a first substrate having a first surface;
   a first lead terminal connected to the first surface;
   a second lead terminal connected to the first surface;
   a container containing the first substrate; and
   a vibrator accommodated in the container,
   wherein the first lead terminal and the second lead terminal intersect each other when viewed in a first direction along the first surface.

8. The electronic component according to claim 7, further comprising:
   a second substrate,
   wherein the first lead terminal has a first end connected to the first surface and a second end connected to the second substrate, and
   the second end is so disposed as to be separate outward from the first substrate when viewed in the second direction.

9. The electronic component according to claim 8,
   wherein the second lead terminal has a third end connected to the first surface and a fourth end connected to the second substrate, and
   the fourth end is so disposed as to be separate outward from the first substrate when viewed in the second direction.

10. The electronic component according to claim 7,
    wherein the first surface has a first edge and a second edge facing the first edge,
    the first lead terminal has a first end connected to an area that is part of the first surface and closer to the first edge than to the second edge, and
    the second lead terminal has a third end connected to an area that is part of the first surface and closer to the second edge than to the first edge.

11. The electronic component according to claim 10, wherein the first and the third end are so disposed as to be oriented in opposite directions.

12. The electronic component according to claim 7, further comprising:
    an element disposed in an area surrounded by the first lead terminal, the second lead terminal, and the first surface when viewed in the first direction.

13. An electronic apparatus comprising:
    an electronic component including:
      a first substrate having a first surface;
      a first lead terminal connected to the first surface; and
      a second lead terminal connected to the first surface,
    wherein the first lead terminal and the second lead terminal intersect each other when viewed in a first direction along the first surface,
    the first lead terminal and the second lead terminal do not overlap with each other when viewed in a second direction perpendicular to the first surface, and
    a crossing point of the first and second lead terminals is aligned with the substrate in the second direction.

* * * * *